(12) United States Patent
Englehart et al.

(10) Patent No.: US 9,311,436 B2
(45) Date of Patent: Apr. 12, 2016

(54) USING AN ELEMENT IN A FIRST MODEL TO CALL A PORTION OF A SECOND MODEL

(71) Applicant: The MathWorks, Inc., Natick, MA (US)

(72) Inventors: Matthew J. Englehart, Olmsted Township, OH (US); Srinath Avadhanula, Sudbury, MA (US); Aravind Pillarisetti, Hopkinton, MA (US); Nirmal K. Gunaseelan, Wayland, MA (US); Peter S. Szpak, Newton, MA (US); Hidayet T. Simsek, Newton, MA (US)

(73) Assignee: The MathWorks, Inc., Natick, MA (US)

( * ) Notice: Subject to any disclaimer, the term of this patent is extended or adjusted under 35 U.S.C. 154(b) by 0 days.

(21) Appl. No.: 14/713,527

(22) Filed: May 15, 2015

(65) Prior Publication Data
US 2015/0331979 A1    Nov. 19, 2015

Related U.S. Application Data

(60) Provisional application No. 61/993,729, filed on May 15, 2014.

(51) Int. Cl.
| | |
|---|---|
| *G06F 17/50* | (2006.01) |
| *G06F 17/15* | (2006.01) |
| *G06F 9/44* | (2006.01) |
| *G06F 9/54* | (2006.01) |

(52) U.S. Cl.
CPC .............. *G06F 17/5009* (2013.01); *G06F 8/34* (2013.01); *G06F 8/35* (2013.01); *G06F 9/541* (2013.01); *G06F 17/15* (2013.01)

(58) Field of Classification Search
USPC .................................. 703/2, 22, 24; 370/295
See application file for complete search history.

(56) References Cited

U.S. PATENT DOCUMENTS

| | | | |
|---|---|---|---|
| 7,020,850 B2 | 3/2006 | Raghavan et al. | |
| 7,024,631 B1 | 4/2006 | Hudson et al. | |
| 8,234,105 B1 | 7/2012 | Aldrich et al. | |
| 2007/0261019 A1 | 11/2007 | Raghavan et al. | |

OTHER PUBLICATIONS

Notification of Transmittal of the International Search Report and the Written Opinion of the International Searching Authority for corresponding PCT Application No. PCT/US2015/031029, mailed Jan. 25, 2016, 16 pages.

*Primary Examiner* — Thai Phan
(74) *Attorney, Agent, or Firm* — Harrity & Harrity, LLP

(57) ABSTRACT

A device may receive function information that describes a caller element that calls a called element that is separate from the caller element. The function information may identify a name or reference of the called element, a passed input, and a passed output. The passed input may be provided by the caller element to the called element, and the passed output may be received by the caller element from the called element. The caller element may be associated with a caller model, and the called element may be associated with a called model. The device may identify the called element, and may execute the caller element in a simulation environment. Execution of the caller element may cause execution of the called element without causing execution of an entirety of the called model. The device may receive the passed output from the called element based on executing the called element.

35 Claims, 28 Drawing Sheets

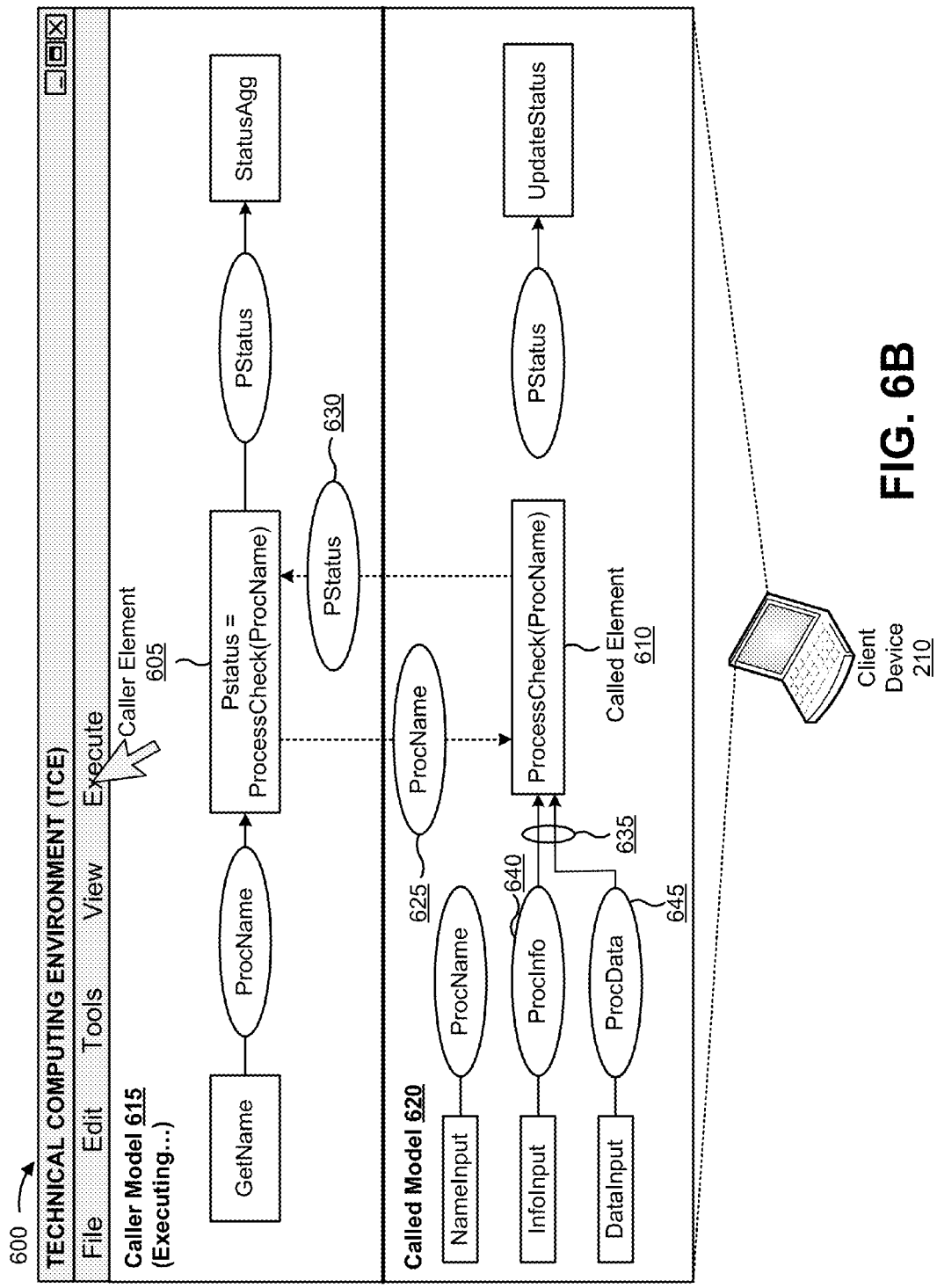

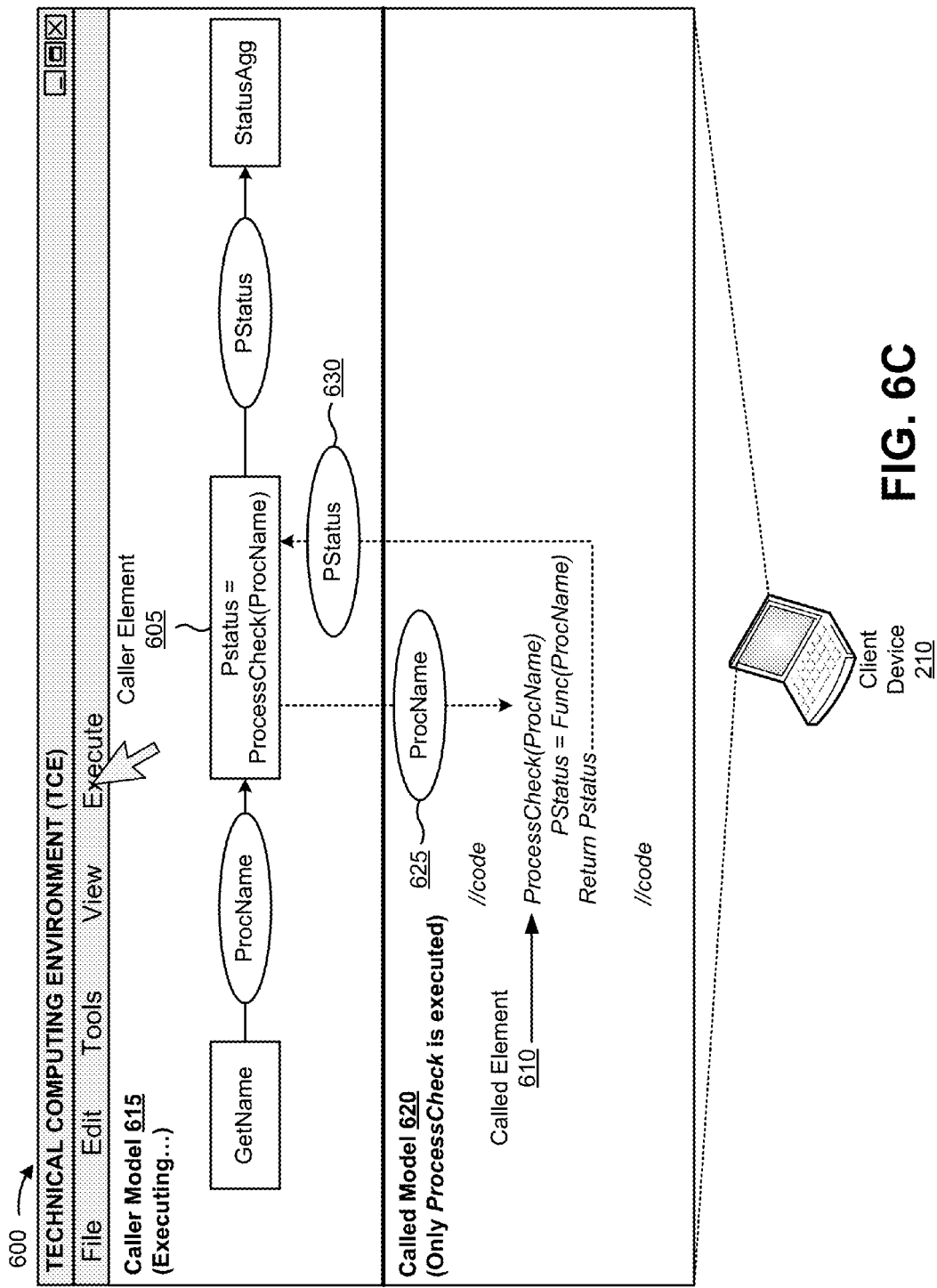

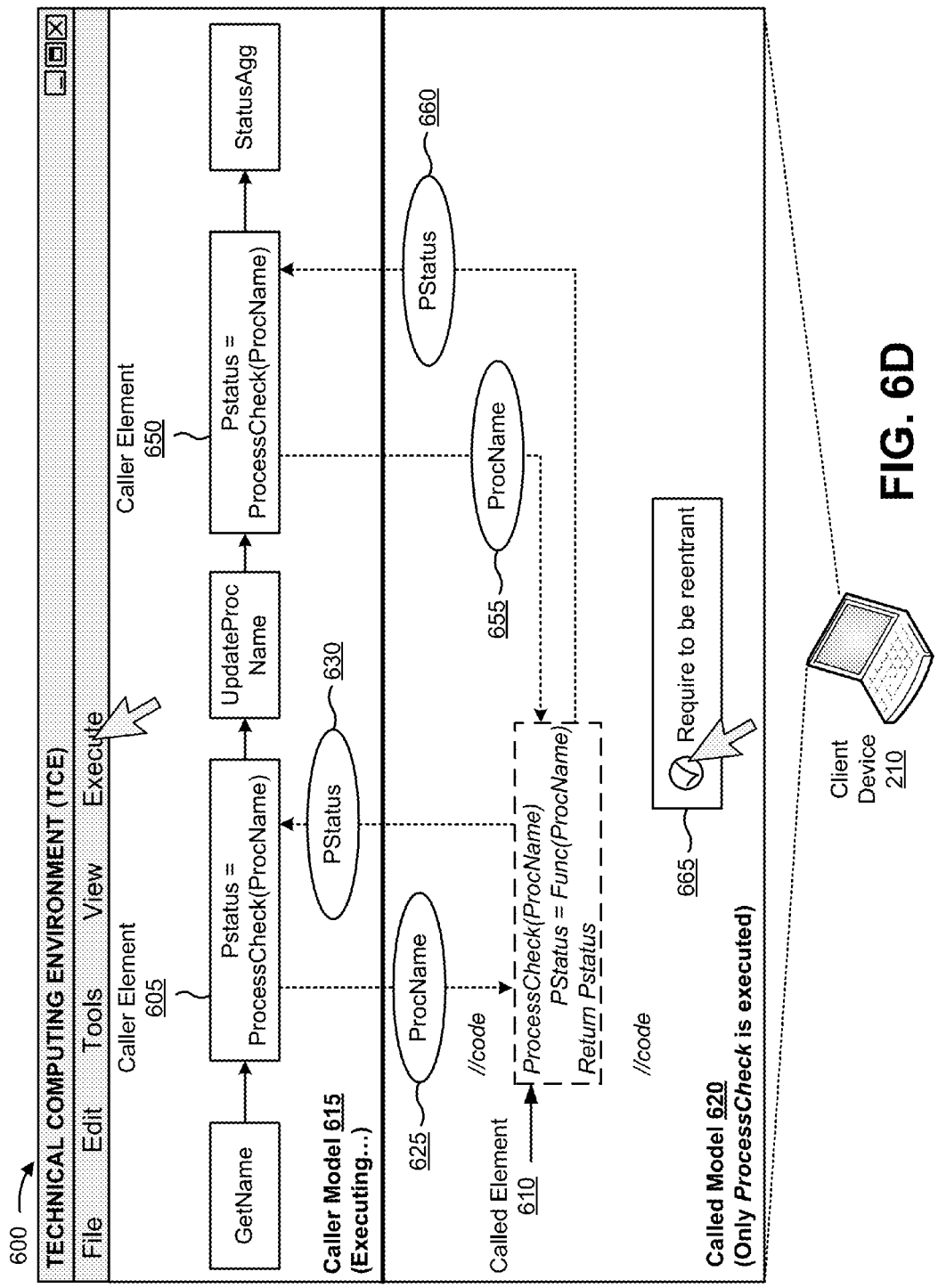

```
real_T rtb_FunctionCaller_o1;
uint8_T rtb_FunctionCaller_o2;

/* FunctionCaller: '<Root>/Function Caller' incorporates:
 *  Import: '<Root>/In1'
 *  Import: '<Root>/In2'
 *  Import: '<Root>/In3'
 */
rtb_FunctionCaller_o1 = Rte_IRead_Runnable_step_In3_In3();
rtb_FunctionCaller_o2 = Rte_Call_foo_client_foo
    (Rte_IRead_Runnable_Step_In2_In2(), Rte_IRead_Runnable_Step_In1_In1(),
    &rtb_FunctionCaller_o1);

/* Outport: '<Root>/Out1' */
Rte_IWrite_Runnable_Step_Out1_Out1(rtb_FunctionCaller_o1);

/* Outport: '<Root>/Out2' */
Rte_IWrite_Runnable_Step_Out2_Out2(rtb_FunctionCaller_o2);
```

USING AN ELEMENT IN A FIRST MODEL TO CALL A PORTION OF A SECOND MODEL

RELATED APPLICATION

This application claims priority under 35 U.S.C. §119 to U.S. Provisional Patent Application No. 61/993,729, filed on May 15, 2014, the content of which is incorporated by reference herein in its entirety.

SUMMARY

According to some possible implementations, a method may include receiving function information that describes a caller element that, when executed, calls a called element that is separate from the caller element. The function information may identify a name or reference of the called element, a passed input, and a passed output. The passed input may be provided by the caller element to the called element. The passed output may be received by the caller element from the called element. The caller element may be associated with a caller model. The called element may be associated with a called model, the called model comprising a set of elements to be executed. The receiving of the function information may be performed by one or more devices. The method may include identifying the called element based on the function information. The identifying may be performed by the one or more devices. The method may include executing the caller element in a simulation environment, whereby the execution of the caller element causes the simulation environment to execute the called element without causing execution of an entirety of the called model, in particular without executing all of the plurality of elements in the called model. The executing may be performed by the one or more devices. The method may include receiving the passed output from the called element based on executing the called element. The receiving the passed output may be performed by the one or more devices.

According to some possible implementations, the method may include receiving the passed output based on the passed input and an internal input. The internal input may be received by the called element from an element other than the caller element.

According to some possible implementations, the method may include producing an internal output based on the internal input. The method may include providing the internal output to another element of the called model. The internal output may not be provided to the caller element.

According to some possible implementations, the method may include providing the passed input to the called element based on executing the caller element. The method may include receiving the passed output from the called element based on providing the passed input to the called element.

According to some possible implementations, the method may include implementing a first type of modeling environment, wherein the first type of modeling environment is a graphical modeling environment and the caller function is modeled as a graphical element and/or block within the graphical modeling environment. The execution of the caller function may cause an interpretation of parameters associated with the caller function at runtime.

According to some possible implementations, the called element may be associated with a second type of modeling environment. The execution of the called function may cause an interpretation of parameters associated the called function at runtime.

According to some possible implementations, the called element may be called by one or more of a plurality of caller elements. The method may include selecting one or more caller elements of the plurality of caller elements for execution. The one or more caller elements may be selected based on a queue that includes the one or more caller elements.

According to some possible implementations, the method may include determining a plurality of called elements. The plurality of called elements being determined based on a function identifier. The method may include selecting one or more called elements of the plurality of called elements for execution. The one or more called elements may be selected based on a conflict rule used for selecting the one or more called elements based on a conflict between called elements or a scope-based rule used for selecting one or more called elements based on a relationship of scope between the one or more called elements and the caller element.

According to some possible implementations, the function information may include a function prototype.

According to some possible implementations, the method may include generating code for one or more of the caller element, the called element, the passed input, the passed output, or the function information.

According to some possible implementations, the method may include locating the called element based on the function identifier and based on a scope associated with the called element. The scope may be indicated by the function information. The scope may identify a locality of the called element.

According to some possible implementations, the method may include determining the called element by generating a template. The template may facilitate an interaction to describe the called element. The template may be generated based on the function information.

According to some possible implementations, the function information may include a sample rate indicator. The sample rate indicator may indicate a sample rate at which to call the called element. When executing the caller element, the method may include executing the caller element based on the sample rate.

According to some possible implementations, a computer readable medium may implement the method described above when executed by a computing device.

According to some possible implementations, a device may implement the method described above. The device may include memory and at least one processor for implementing the method.

According to some possible implementations, a computer-readable medium may store instructions that, when executed by one or more processors, may cause the one or more processors to receive function information that describes a caller element that, when executed, calls a called element that is separate from the caller element. The function information may identify a name or reference of the called element, a passed input, and a passed output. The passed input may be provided by the caller element to the called element. The passed output may be received by the caller element from the called element. The caller element may be associated with a caller model. The called element may be associated with a called model, and the called model may comprise a set of elements to be executed. The one or more instructions, when executed by one or more processors, may cause the one or more processors to identify the called element based on the function information. The one or more instructions, when executed by one or more processors, may cause the one or more processors to execute the caller element in a simulation environment, whereby the execution of the caller element causes the simulation environment to execute the called element without causing execution of an entirety of the called model, in particular without executing all of the set of elements in the called model. The one or more instructions, when executed by one or more processors, may cause the one or more processors to receive the passed output from the called element based on executing the called element.

According to some possible implementations, a device may include one or more processors. The one or more processors may receive function information that describes a caller element that, when executed, calls a called element that is separate from the caller element. The function information may identify a name or reference of the called element, a passed input, and a passed output. The passed input may be provided by the caller element to the called element. The passed output may be received by the caller element from the called element. The caller element may be associated with a caller model. The called element may be associated with a called model, and the called model may comprise a set of elements to be executed. The one or more processors may identify the called element based on the function information. The one or more processors may execute the caller element in a simulation environment, whereby the execution of the caller element may cause the simulation environment to execute the called element without causing execution of an entirety of the called model, in particular without executing all of the plurality of elements in the called model. The one or more processors may receive the passed output from the called element based on executing the called element.

According to some possible implementations, a method may include generating code for a caller element of a first graphical model and a called element of a second graphical model. The method may include generating a first function, the first function representing an interface between the caller element and the called element, through which the caller element calls the called element, the first function. The first function may include one or more first input arguments that may correspond to one or more input variables of the caller element. One or more first output arguments may correspond to one or more output variables of the caller element, the called element comprising the one or more input variables and the one or more output variables passed from the caller element. The method may include generating a second function, the second function representing an underlying function of the called element. The underlying function may include at least one of the one or more input variables passed from the caller element and at least one of the one or more output variables. The underlying function may additionally include one or more internal input variables and one or more internal output. variables. The second function may include one or more second input arguments that may correspond to the at least one of the one or more input variables and the one or more internal input variables. One or more second output arguments may correspond to the at least one of the one or more output variables and the one or more internal output variables. The generating of the code may be performed by one or more devices.

According to some possible implementations, the caller element may comprise a first function prototype and the called element may comprise a second function prototype. The caller element may call the called element by matching the first and second function prototypes. The first function may generate based on the first or the second function prototype.

According to some possible implementations, the method may include generating code. The method may include generating code for the caller element at a first time and generating code for the called element at a second time different from the first time, wherein the first function is generated at the first time based on the first function prototype when the first time is earlier than the second time.

According to some possible implementations, the method may include generating AUTOSAR compliant code. The method may include mapping the first function prototype or the second function prototype to an AUTOSAR client to generate the first function. The method may include mapping the one or more input variables and one or more output variables to arguments of an AUTOSAR server to generate the one or more first input arguments and the one or more first output arguments of the first function.

According to some possible implementations, the method may include generating code that may include mapping the caller element and the called element from a graphical environment to a software environment implementing a software architecture standard.

According to some possible implementations, the software architecture standard may include AUTOSAR software architecture standard.

According to some possible implementations, the method may include generating the first function or the second function. The method may include generating the one or more first input arguments and first output arguments based on one or more predetermined rules. The method may include generating the one or more second input arguments and second output arguments, based on the one or more predetermined rules.

According to some possible implementations, the one or more predetermined rules may be user specified.

According to some possible implementations, the one or more predetermined rules may include rules that specify an order in which the one or more first input arguments and first output arguments may be arranged, or the one or more second input arguments and second output arguments may be arranged.

According to some possible implementations, the one or more predetermined rules may include rules that specify one or more names for the one or more first input arguments and first output arguments, or one or more names for the one or more second input arguments and second output arguments.

According to some possible implementations, the caller element may include an in-out variable, the in-out variable may be both one of the one or more output variables and one of the one or more input variables, and the first function may include an argument that represents the in-out variable and passes value of the in-out variable by reference.

According to some possible implementations, the one or more second input arguments may correspond to the one or more internal input or output variables that are global variables within the second model, and data for the global variables may be accessed globally within the second model directly or indirectly.

According to some possible implementations, accessing data directly may include passing data directly to the global variables.

According to some possible implementations, accessing data indirectly may include accessing data stored in memory.

According to some possible implementations, for the one or more second input arguments corresponding to the one or more internal input or output variables, the second function may call a data access method to obtain data for the variables.

According to some possible implementations, the first function and the second function may be generated as an inline function.

According to some possible implementations, the caller element may be one of a Simulink® block, a Simulink-compatible block, a Stateflow® block, a Stateflow-compatible block, a MATLAB® block, or a MATLAB-compatible block.

According to some possible implementations, the called element may be one of a Simulink® block, a Simulink-compatible block, a Stateflow® graphical function, or a Stateflow-compatible graphical function.

According to some possible implementations, the first model and the second model may be the same model.

According to some possible implementations, generating code may include generating at least one of: C code, C++ code, Ada code, or executable code.

According to some possible implementations, the method may include generating code for two or more called elements including the called element, wherein the two or more called elements may be within a subsystem that represent a collection of functions that are generated as member functions of a C++ class.

According to some possible implementations, a computer readable medium may implement the method described above when executed by a computing device.

According to some possible implementations, a device may implement the method described above. The device may include memory and at least one processor for implementing the method.

According to some possible implementations, a computer-readable medium may store instructions that, when executed by one or more processors, may cause the one or more processors to generate code for a caller element of a first graphical model and a called element of a second graphical model. The one or more instructions, when generating the code, may cause the one or more processors to generate a first function, the first function representing an interface between the caller element and the called element, through which the caller element calls the called element. The first function may include one or more first input arguments corresponding to one or more input variables of the caller element and one or more first output arguments corresponding to one or more output variables of the caller element, the called element comprising the one or more input variables and the one or more output variables passed from the caller element. The one or more instructions, when executed by one or more processors, may cause the one or more processors to generate a second function, the second function representing an underlying function of the called element. The underlying function may include at least one of the one or more input variables passed from the caller element and at least one of the one or more output variables. The underlying function may additionally include one or more internal input variables and one or more internal output variables. One or more second input arguments may correspond to the at least one of the one or more input variables and the one or more internal input variables. One or more second output arguments may correspond to the at least one of the one or more output variables and the one or more internal output variables.

According to some possible implementations, a device may include one or more processors. The one or more processors may generate code for a caller element of a first graphical model and a called element of a second graphical model. The one or more processors, when generating the code, may generate a first function, the first function representing an interface between the caller element and the called element, through which the caller element calls the called element. The first function may include one or more first input arguments corresponding to one or more input variables of the caller element. One or more first output arguments may correspond to one or more output variables of the caller element. The called element may include the one or more input variables and the one or more output variables passed from the caller element. The one or more processors may generate a second function, the second function representing an underlying function of the called element. The underlying function may include at least one of the one or more input variables passed from the caller element and at least one of the one or more output variables. The underlying function may additionally include one or more internal input variables and one or more internal output variables. The second function may include one or more second input arguments corresponding to the at least one of the one or more input variables and the one or more internal input variables. The second function may include one or more second output arguments corresponding to the at least one of the one or more output variables and the one or more internal output variables.

BRIEF DESCRIPTION OF THE DRAWINGS

FIGS. 6A-6D are diagrams of an example implementation of calling and executing a called element using a caller element;

FIG. 20 is a diagram of example AUTOSAR compliant code generated for a function caller block and a function.

DETAILED DESCRIPTION

Figure 1:
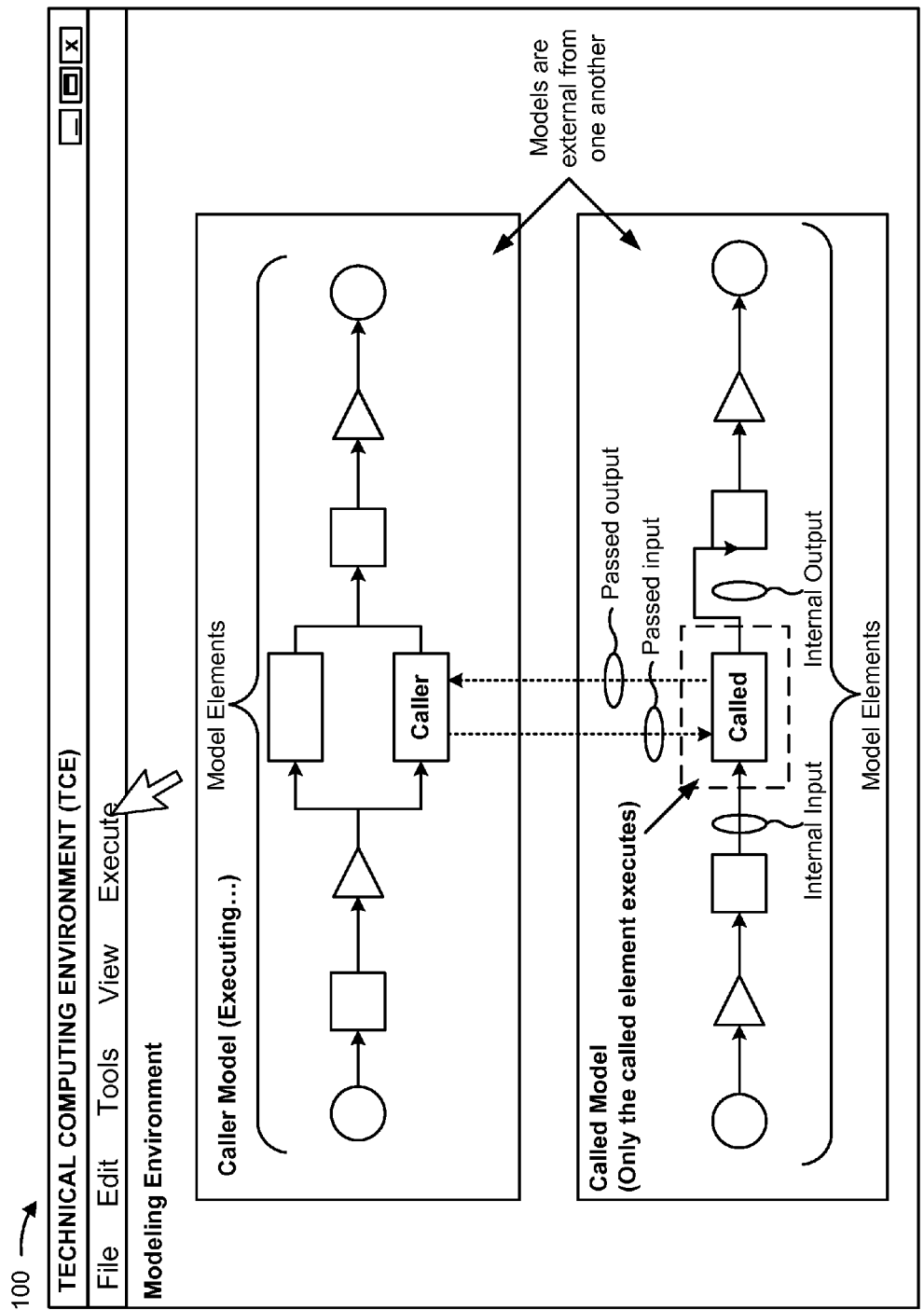
FIG. 1 is a diagram of an overview of an example implementation described herein.

The following detailed description of example implementations refers to the accompanying drawings. The same reference numbers in different drawings may identify the same or similar elements.

A modeling environment may be used to create or execute a model, which may be used to simulate behavior of a physical system. At times, a user of the modeling environment may want a first model to execute a portion of a second model. The modeling environment may not permit the first model to execute a portion of the second model, and may only permit the first model to execute the entire second model rather than a portion of the second model.

Furthermore, a user of the modeling environment may not know specific syntaxes needed to call a portion of the second model from the first model. For example, the first model and the second model may be different models that use different syntaxes, may have been designed by different users and/or vendors, may be included in different modeling environments that use different syntaxes, or the like. Implementations described herein permit a first model to call a function that causes execution of a portion of a second model (e.g., a function included in the second model). Such implementations may call the function in a syntax-neutral way that does not require the user to know the specifics of a syntax associated with the second model to call the portion of the second model from the first model. Implementations described herein may also conserve computing resources that would otherwise be used to execute the entire second model, rather than the portion of the second model.

As an example, assume that a first model is used to simulate behavior of an antilock braking system (ABS) of an automobile, and that a second model is used to simulate behavior of dashboard instrumentation of the automobile. The first model and the second model may have different syntaxes, and may have been designed by different vendors. In some cases, the model of the ABS may need to call a portion of the model of the dashboard instrumentation, such as to simulate turning on a light on the dashboard when the ABS engages. Implementations described herein may permit the first model (e.g., the ABS model) to call a portion of the second model (e.g., an ABS light element included in the dashboard instrumentation model), rather than the entire second model.

As further described herein, a caller element, e.g., in the form of a function caller block, a Stateflow transition, or a MATLAB function, in a model can be implemented to invoke a called element, e.g., in the form of a Simulink® function or a Stateflow® graphical function. The caller element and the called element can be in the same model or different models. Code can be generated for the caller and called elements, based on the block semantics and, optionally, additional rules, e.g., user specified rules. For example, instead of performing an automatic mapping, the rules can specify the mapping of the passed input, passed output, and passed in-out data/ports of the caller element and the called element to various implementations, including function arguments, data access methods, and global variables.

In some implementations, a function argument specification can be defined automatically or based on the rules to apply to the caller or called elements. The specification can determine the mapping of one or more, e.g., a subset of the passed input, output, and in-out data/ports of the elements to function arguments in the generated code. For example, the specification can control the argument names, the argument order, the argument qualifiers (e.g., "const" or "volatile"), and which arguments, if any, are to be returned by value.

In some implementations, the caller and called elements can be mapped to a software environment that implements coding standards, e.g., the AUTOSAR software architecture standard, and code complying with the coding standards can be generated. For example, the called elements can be mapped to an AUTOSAR server. The input, output, and in-out variables/ports of the function can be mapped to AUTOSAR server arguments. A server argument specification of AUTOSAR can control the argument names, the argument order, the argument qualifiers, and which argument, if any, is to be returned by value.

FIG. 1 is a diagram of an overview of an example implementation 100 described herein. As shown in FIG. 1, assume that a computing environment (e.g., a technical computing environment, or TCE) is executing on a device. Assume that the computing environment includes a modeling environment that hosts a first model and a second model that are external from one another (e.g., that are different models). While a single modeling environment is shown that contains both models, in some implementations, one model may be included in a first modeling environment, and another model may be included in another modeling environment. As shown, assume that the first model, which may be referred to as a caller model, includes a caller element, shown as "Caller." As further shown, assume that the second model, which may be referred to as a called model, includes a called element, shown as "Called." The caller element in the caller model may call the called element in the called model. When executed, the caller model may cause a portion of the called model to execute, without causing execution of the entire called model. For example, the caller model may cause the called element of the called model to execute.

As an example, execution of the caller element may trigger execution of the called element, which may cause data to be passed between the caller element and the called element. The data that is passed between the caller element and the called element may be referred to as passed data. The caller element may provide passed data as a passed input to the called element. The called element may operate on the passed input, and may provide a result of the operation, as passed output, to the caller element. The caller element may use the passed data, received from the called element, in the context of the caller model.

In some implementations, the called element may interact with other elements in the called model using internal data. For example, the called element may receive an internal input from a first element of the called model, may perform an operation on the internal input, and may provide a result of the operation, as internal output, to a second element of the called model. The called element may generate the internal output independent of the passed data. In some implementations, the called element may use the internal data to generate passed data. For example, the called element may receive a passed input from the caller element, may receive an internal input, and may use the passed input and the internal input to generate a passed output to be provided to the caller element as, for example, a passed output.

In this way, the modeling environment may call and/or execute a called element (e.g., a function), included in a called model, without executing the entire called model, thus conserving computing resources. While the caller element and the called element are shown in separate models in FIG. 1, in some implementations, the caller element and the called element may be in the same model. In either case, the caller element and the called element may be separate elements.

Figure 2:
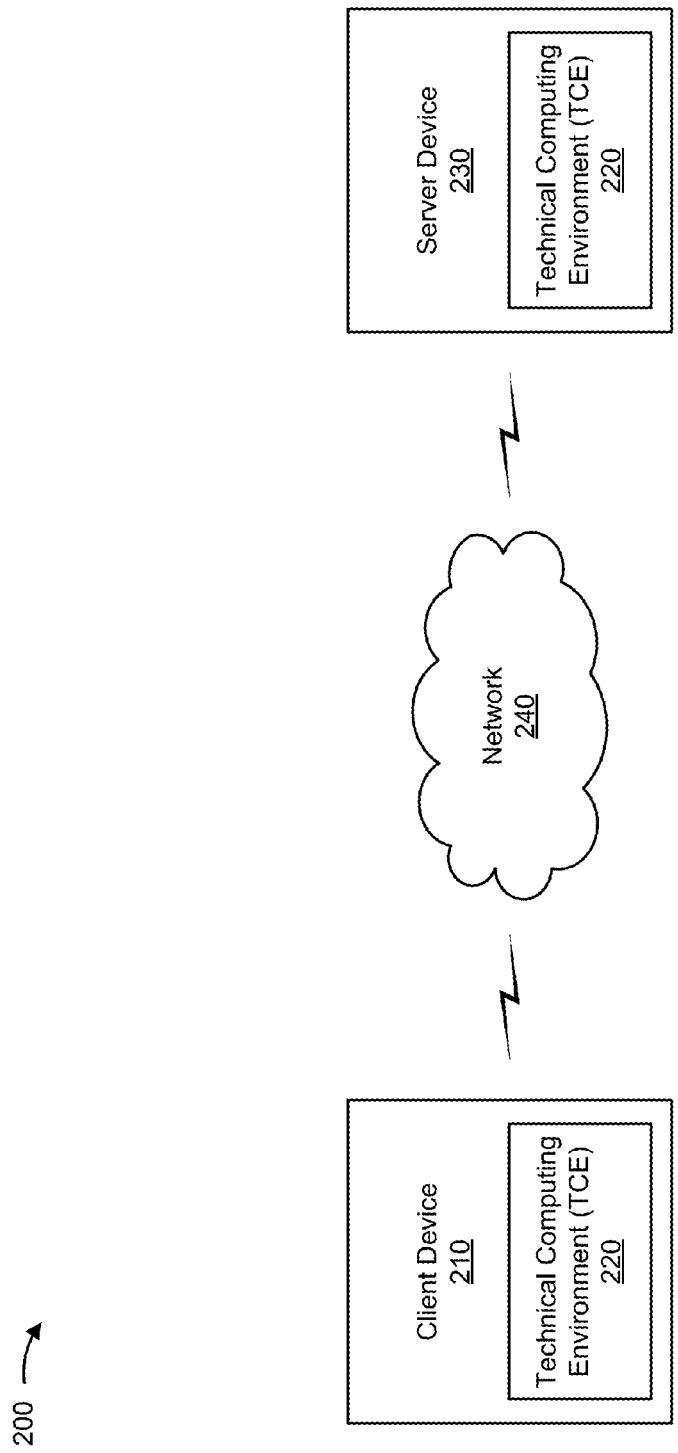
FIG. 2 is a diagram of an example environment in which systems and/or methods, described herein, may be implemented.

FIG. 2 is a diagram of an example environment 200 in which systems and/or methods, described herein, may be implemented. As shown in FIG. 2, environment 200 may include a client device 210, which may include a technical computing environment (TCE) 220. Furthermore, environment 200 may include a server device 230, which may include TCE 220, and a network 240. Devices of environment 200 may interconnect via wired connections, wireless connections, or a combination of wired and wireless connections.

Client device 210 may include one or more devices capable of receiving, generating, storing, processing, and/or providing a model and/or information associated with the model. For example, client device 210 may include a computing device, such as a desktop computer, a laptop computer, a tablet computer, a mobile phone (e.g., a smart phone, a radiotelephone, etc.), or a similar device. Client device 210 may execute a first model, which may cause execution of a portion of a second model, without causing execution of the entire second model. For example, execution of the first model may cause execution of one or more elements of the second model. In some implementations, the first model and the second model may be included in the same modeling environment. In some implementations, the first and second model may be included in different modeling environments. In some implementations, client device 210 may receive information from and/or transmit information to server device 230 (e.g., information associated with the first model, information associated with the second model, information associated with a caller element, information associated with a called element, etc.).

Client device 210 may host TCE 220. TCE 220 may include any hardware-based component or a combination of hardware and software-based components that provides a computing environment (e.g., a modeling environment) that allows tasks to be performed (e.g., by users) related to disciplines, such as, but not limited to, mathematics, science, engineering, medicine, and business. TCE 220 may include a text-based modeling environment (e.g., MATLAB® software by The MathWorks, Inc.), a graphically-based modeling environment (e.g., Simulink® software, SimEvents® software, etc., by The MathWorks, Inc.; VisSim by Visual Solutions; LabView® by National Instruments; Agilent VEE by Agilent Technologies; Advanced Design System (ADS) by Agilent Technologies; Agilent Ptolemy by Agilent Technologies; etc.), a state-based modeling environment (e.g., Stateflow® software), or another type of environment, such as a hybrid modeling environment that may include, for example, a text-based modeling environment, a graphically-based environment, and/or a state-based modeling environment.

TCE 220 may be integrated with or operate in conjunction with a graphically-based modeling environment, which may provide graphical tools for constructing a model. TCE 220 may include additional tools, such as tools designed to convert a model into an alternate representation, such as program code, source computer code, compiled computer code, a hardware description (e.g., a description of a circuit layout), or the like. In some implementations, TCE 220 may provide this ability using graphical toolboxes (e.g., toolboxes for signal processing, image processing, color manipulation, data plotting, parallel processing, etc.). In some implementations, TCE 220 may provide these functions as block sets. In some implementations, TCE 220 may provide these functions in another way.

A model generated using TCE 220 may include, for example, equations, assignments, constraints, computations, algorithms, process flows, or the like. The model may be implemented in a modeling environment as, for example, a time-based block diagram (e.g., via the Simulink software), a discrete-event based diagram (e.g., via the SimEvents software), a dataflow diagram, a state transition diagram (e.g., via the Stateflow software), a software diagram, a textual array-based and/or dynamically typed language (e.g., via the MATLAB software), a list or tree, and/or another form. A model generated using TCE 220 may include, for example, a model of a physical system, a computing system, an engineered system, an embedded system, a biological system, a chemical system, or the like.

A model element (e.g., an element) in the model may include, for example, a function in a modeling environment (e.g., a MATLAB function), an object in a modeling environment (e.g., a MATLAB system object), a block in a graphically-based modeling environment (e.g., a Simulink block, a LabView block, an Agilent VEE block, an Agilent ADS block, an Agilent Ptolemy block, etc.), a state representation in a state-based modeling environment (e.g., a Stateflow chart), or the like.

TCE 220 may schedule and/or execute a model using one or more computational resources, such as one or more central processing units (CPUs) or cores, one or more field programmable gate arrays (FPGAs), one or more graphics processing units (GPUs), and/or other elements that can be used for computation. TCE 220 may include a compiler that may be used to schedule the model elements of the model, allocate hardware resources, such as memory and CPUs, to the model elements and to the connections that interconnect the model elements, or the like.

Server device 230 may include one or more devices capable of receiving, generating, storing, processing, and/or providing a model and/or information associated with the model. For example, server device 230 may include a computing device, such as a server, a desktop computer, a laptop computer, a tablet computer, or a similar device. In some implementations, server device 230 may host TCE 220. In some implementations, client device 210 may be used to access one or more TCEs 220 running on one or more server devices 230. For example, multiple server devices 230 may be used to execute program code, a model, a model element, or the like (e.g., serially or in parallel), and may provide respective results of executing the program code, the model, the model element, or the like, to client device 210.

In some implementations, client device 210 and server device 230 may be owned by different entities. For example, an end user may own client device 210, and a third party may own server device 230. In some implementations, server device 230 may include a device operating in a cloud computing environment. In this way, front-end applications (e.g., a user interface) may be separated from back-end applications (e.g., program code execution). Additionally, or alternatively, server device 230 may perform one, more, or all operations described elsewhere herein as being performed by client device 210.

Network 240 may include one or more wired and/or wireless networks. For example, network 240 may include a cellular network, a public land mobile network (PLMN), a local area network (LAN), a wide area network (WAN), a metropolitan area network (MAN), a telephone network (e.g., the Public Switched Telephone Network (PSTN)), an ad hoc network, an intranet, the Internet, a fiber optic-based network, a private network, a cloud computing network, and/or a combination of these or other types of networks.

The number and arrangement of devices and networks shown in FIG. 2 are provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of environment 200 may perform one or more functions described as being performed by another set of devices of environment 200.

Figure 3:
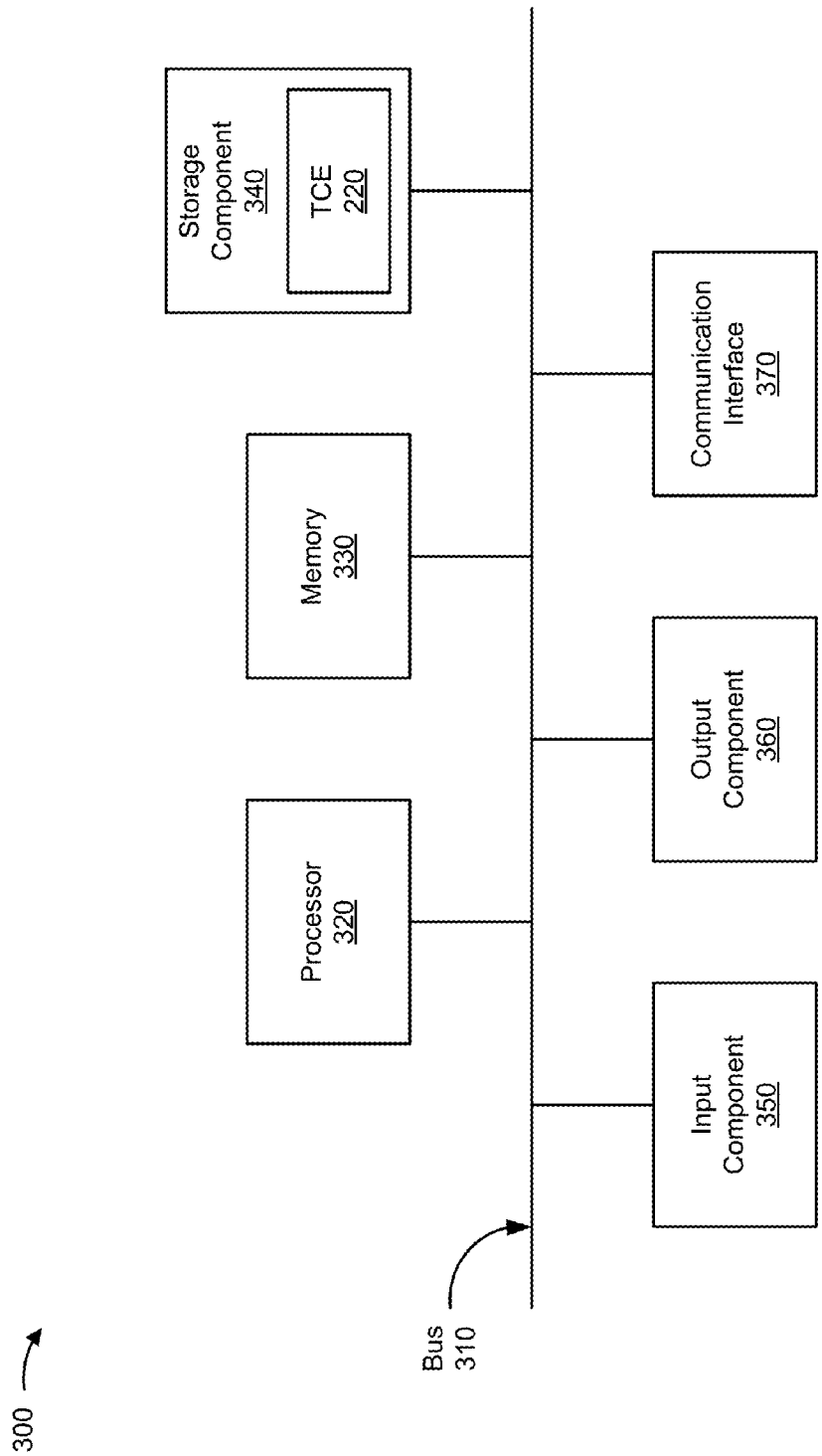
FIG. 3 is a diagram of example components of one or more devices of FIG. 2.

FIG. 3 is a diagram of example components of a device 300. Device 300 may correspond to client device 210 and/or server device 230. In some implementations, client device 210 and/or server device 230 may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 may include a component that permits communication among the components of device 300. Processor 320 is implemented in hardware, firmware, or a combination of hardware and software. Processor 320 may include a processor (e.g., a central processing unit (CPU), a graphics processing unit (GPU), an accelerated processing unit (APU), etc.), a microprocessor, and/or any processing component (e.g., a field-programmable gate array (FPGA), an application-specific integrated circuit (ASIC), etc.) that interprets and/or executes instructions, and/or that is designed to implement one or more computing tasks. In some implementations, processor 320 may include multiple processor cores for parallel computing. Memory 330 may include a random access memory (RAM), a read only memory (ROM), and/or another type of dynamic or static storage device (e.g., a flash memory, a magnetic memory, an optical memory, etc.) that stores information and/or instructions for use by processor 320.

Storage component 340 may store information and/or software related to the operation and use of device 300. For example, storage component 340 may include a hard disk (e.g., a magnetic disk, an optical disk, a magneto-optic disk, a solid state disk, etc.), a compact disc (CD), a digital versatile disc (DVD), a floppy disk, a cartridge, a magnetic tape, and/or another type of computer-readable medium, along with a corresponding drive. In some implementations, storage component 340 may store TCE 220.

Input component 350 may include a component that permits device 300 to receive information, such as via user input (e.g., a touch screen display, a keyboard, a keypad, a mouse, a button, a switch, a microphone, etc.). Additionally, or alternatively, input component 350 may include a sensor for sensing information (e.g., a global positioning system (GPS) component, an accelerometer, a gyroscope, an actuator, etc.). Output component 360 may include a component that provides output information from device 300 (e.g., a display, a speaker, one or more light-emitting diodes (LEDs), etc.).

Communication interface 370 may include a transceiver-like component (e.g., a transceiver, a separate receiver and transmitter, etc.) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, a radio frequency (RF) interface, a universal serial bus (USB) interface, a Wi-Fi interface, a cellular network interface, or the like.

Device 300 may perform one or more processes described herein. Device 300 may perform these processes in response to processor 320 executing software instructions stored by a computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4A:
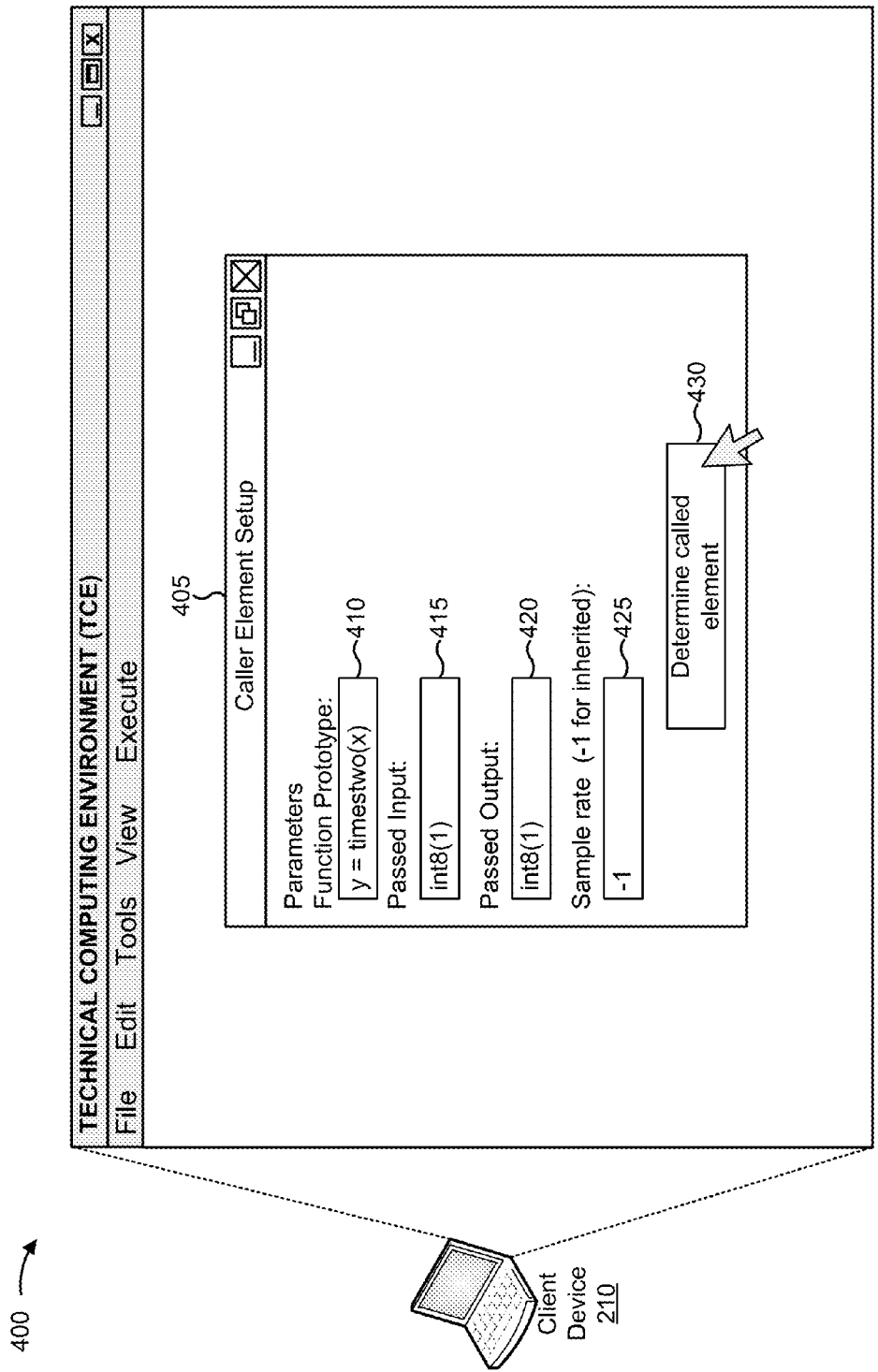
FIGS. 4A-4C are diagrams of an example implementation of determining a called element and a caller element to call the called element.
Figure 4B:
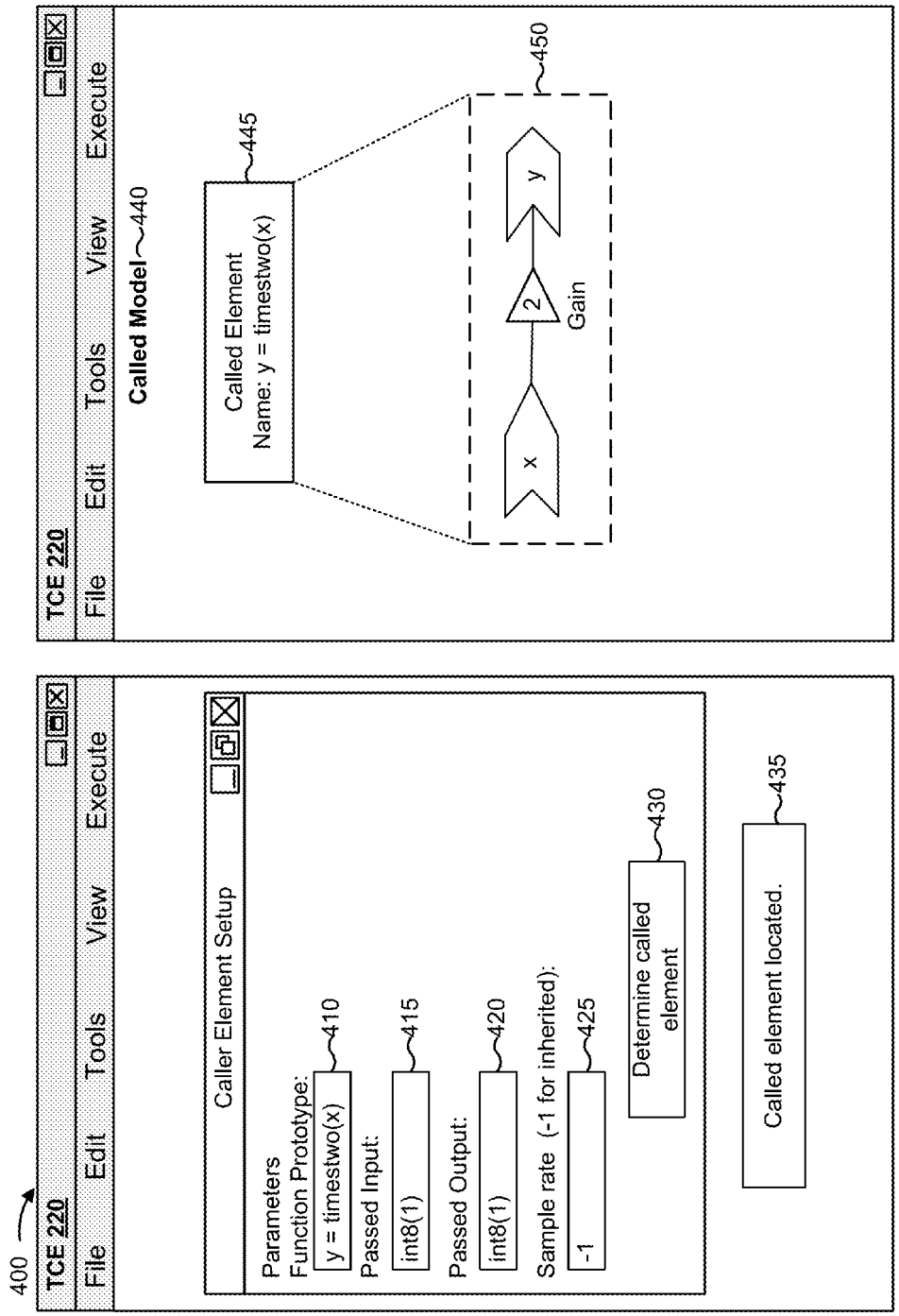
Figure 4C:
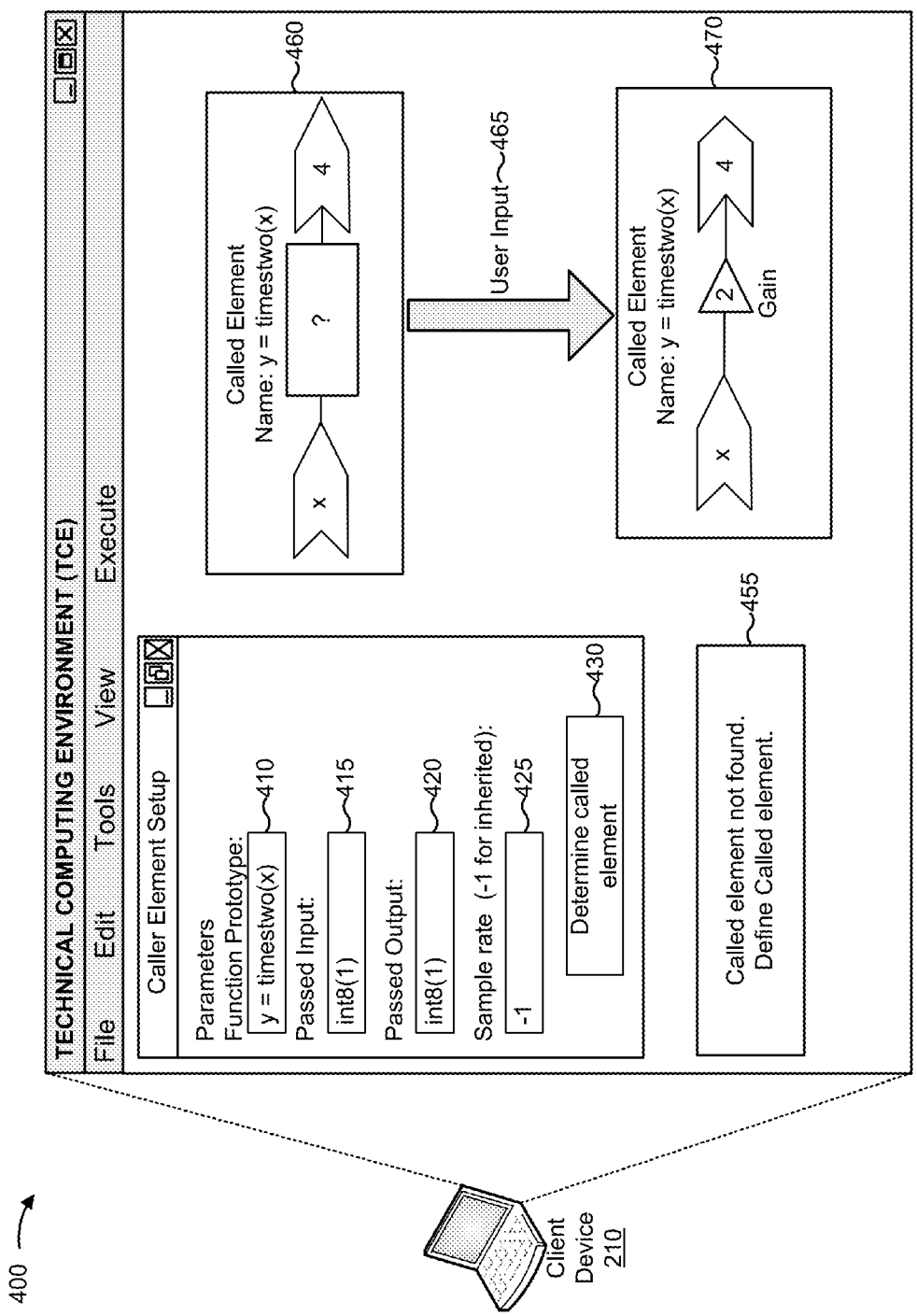

FIGS. 4A-4C are diagrams of an example implementation 400 of determining a called element and a caller element to call the called element. For the purpose of FIGS. 4A-4C, assume that client device 210 is capable of accessing a caller model and a called model, which may be different models. Assume further that client device 210 facilitates communication between model elements of the caller model and the called model. For example, the caller model may include a caller element that interacts with a called element included in the called model. In some implementations, the operations described in connection with FIGS. 4A-4C may be performed by another device or a group of devices separate from or including client device 210, such as server device 230.

As shown in FIG. 4A, client device 210 may provide a user interface 405 to facilitate setup of the caller element and/or the called element. A user may interact with user interface 405 to generate the caller element and/or the called element. The caller element may provide a passed input to the called element, may receive a passed output from the called element, and/or may cause execution of the called element.

As further shown in FIG. 4A, user interface 405 may receive input that identifies a set of parameters. For example, client device 210 may receive input that identifies a function prototype 410 that identifies a function identifier (e.g., a function name) for the caller element (e.g., a caller element identifier), a quantity of passed inputs associated with the caller element, and/or a quantity of passed outputs associated with the caller element. In this example, function prototype 410 indicates a function name of "timestwo," a single passed input of "x," and a single passed output of "y."

As further shown in FIG. 4A, client device 210 may receive information associated with a passed input 415. For example, client device 210 may receive an input of "int8(1)," which may indicate that passed input 415 is an eight bit integer. As further shown, client device 210 may receive information associated with a passed output 420. For example, client device 210 may receive an input of "int8(1)," which may indicate that passed output 420 is also an eight bit integer.

As further shown, client device 210 may receive a sample rate indicator 425. Sample rate indicator 425 may indicate a sample rate at which the caller element is to be executed. For example, if the called element is capable of executing two times per second, sample rate indicator 425 may indicate that the caller element is to be executed two times per second. In some cases, sample rate indicator 425 may indicate that the caller element is to inherit a sample rate from the called element, or that the called element is to inherit a sample rate from the caller element.

For the purpose of FIG. 4A, assume that client device 210 determines the sample rate based on the called element. As further shown, a user may interact with a run button 430 to cause client device 210 to determine the called element. For example, run button 430 may cause client device 210 to locate the called element based on the function name provided with function prototype 410, may cause client device 210 to generate the called element based on function prototype 410, or the like. In some implementations, client device 210 may determine the called element automatically, without user input (e.g., based on receiving function prototype 410, or the like). In some implementations, when the function prototype of a caller element matches the function prototype of a called element, the called element is triggered to execute independently of all other elements of the model in which the called element is contained. For example, two identical function prototypes can match. In some implementations, during the triggered execution, input variables/ports of the called element can use existing data from a last execution of elements, e.g., blocks, connected to the called element or can use current data provided from a data source. The triggered execution can be performed without the current data being ready and can instead use existing, old data.

As shown in FIG. 4B, a response window 435 may be used to display information related to an operation associated with run button 430. For example, response window 435 may display information about a called model 440 and/or a called element 445 based on the function name provided with function prototype 410. In this case, assume that client device 210 has located called element 445 by searching the called model 440 for called element 445 using the function name of "timestwo" identified in the function prototype 410. Called element 445 may be associated with called model 440. For example, called element 445 may be defined in called model 440, may be included as an element of called model 440, or the like. As shown by reference number 450, called element 445 may receive an input (e.g., x), may perform an operation on the input (e.g., a gain operation with a parameter of 2, to double the input), and may determine an output of the operation (e.g., y).

For the purpose of FIG. 4C, assume that the operations shown in FIG. 4A have been performed. For example, assume that client device 210 has received input that identifies a set of parameters associated with setting up a caller element and a called element, and that a user has interacted with run button 430. In this case, assume that client device 210 fails to locate a called element with a function name of "timestwo" (e.g., based on the called element not being defined, being outside a scope of a search for the called element, or the like). Based on failing to locate the called element with a function name of "timestwo," client device 210 may provide a prompt 455 for the user to define the called element.

As shown, client device 210 may generate a template 460 that includes one input (e.g., a passed input) and one output (e.g., a passed output) based on function prototype 410, which indicates that the called element includes one passed input 415 and one passed output 420. Assume that client device 210 provides template 460 for display. The user may provide input 465 to generate the called element based on template 460. Assume that the user specifies a gain operation with a parameter of 2, to double an input, for the called element. Client device 210 may generate a called element 470 based on user input 465.

While FIG. 4C describes client device 210 as generating called element 470 based on user input 465, in some implementations, client device 210 may generate called element 470 automatically, without user input. For example, client device 210 may generate called element 470 based on the function name, based on information associated with function prototype 410, based on information associated with the caller element, based on information associated with the called element, or the like.

In this way, client device 210 may locate and/or generate a called element based on input related to a caller element, which may allow client device 210 to execute the called element to determine one or more passed outputs, to be passed to the caller element, without executing the entire called model in which the called element is included.

As indicated above, FIGS. 4A-4C are provided as an example. Other examples are possible and may differ from what was described with regard to FIGS. 4A-4C.

Figure 5:
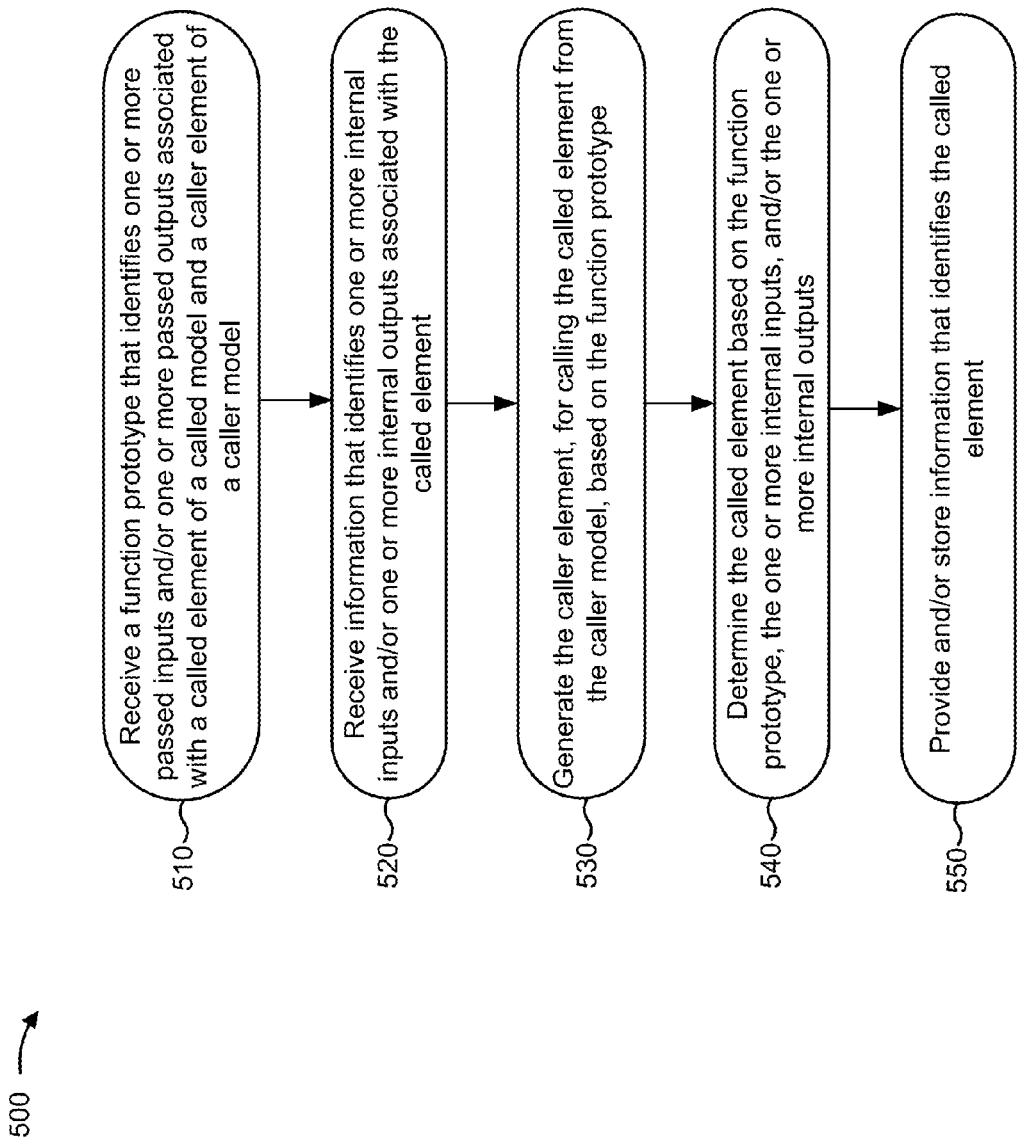
FIG. 5 is a flow chart of an example process for determining a called element and a caller element to call the called element.

FIG. 5 is a flow chart of an example process 500 for determining a called element and a caller element to call the called element. In some implementations, one or more process blocks of FIG. 5 may be performed by client device 210. In some implementations, one or more process blocks of FIG. 5 may be performed by another device or a set of devices separate from or including client device 210, such as server device 230.

As shown in FIG. 5, process 500 may include receiving a function prototype that identifies one or more passed inputs and/or one or more passed outputs associated with a called element of a called model and a caller element of a caller model (block 510). For example, client device 210 may receive a function prototype, as described above in connection with FIG. 4A. The function prototype may identify a function identifier (e.g., a function name, a pointer to the function, a unique identifier for the function, etc.), one or more passed inputs (e.g., passed from a caller element to a called element), one or more passed outputs (e.g., passed from the called element to the caller element), a namespace for the function identifier, or the like. In some implementations, client device 210 may receive the function prototype based on user input. In some implementations, client device 210 may receive the function prototype automatically without user input. For example, client device 210 may open a file containing the function prototype, may receive the function prototype from another device, or the like. Client device 210 may use the function prototype to generate a caller element that causes client device 210 to execute, provide passed inputs to, and/or receive passed outputs from a called element.

The caller element may be an element of a caller model. The caller element may include a model element that, when executed, receives an input (e.g., from within the caller model) and passes the input, as a passed input, to a called element included in a called model. The caller element may further cause the called element to be executed without executing the entire called model. Execution of the called element may cause the called element to perform an operation on the passed input to generate a passed output to be provided to the caller element. In some implementations, the called element may provide one or more passed outputs to the caller element. In some implementations, the called element may provide one or more passed outputs to another element (e.g., an element of the called model, an element of the caller model, an element of a model other than the called model or the caller model, etc.). The caller element may provide the one or more passed outputs to another element of the caller model.

The called model and the caller model may be different models. For example, the called model and the caller model may be stored in different files, may have been created by different users and/or vendors, may have been created at different times, may use different versions and/or types of software, may use different versions and/or types of code, may be separately and/or independently executable, or the like. In some implementations, the called model and the caller model may be associated with different modeling environments (e.g., different TCEs 220). For example, the called model and the caller model may by executable in different modeling environments, may have been created using different modeling environments, may be stored using different file formats, or the like.

In some implementations, the caller model and the called model may be the same model. For example, the caller element may be an element of a model, and the called element may be another element of the same model. While the caller model and the called model are described herein as being different models in some implementations, the caller model and the called model may be the same model, and may operate in a similar manner as described herein with respect to the caller element and the called element being elements of different models.

The called element may receive one or more internal inputs that are internal to the called model, and may provide one or more internal outputs to a model element of the called model. For example, the called element may receive an internal input from an element included in the called model, may determine an internal output based on the internal input, and may provide the internal output to another element of the called model. The internal input and the internal output may operate independently from the caller model.

The function prototype may include information that describes a passed input and/or a passed output. A passed input may include, for example, an input argument that is passed from a caller element (e.g., a function caller) to a called element (e.g., a function). Thus, the passed input may represent an input argument of a function (e.g., $Arg_{in}$). Similarly, a passed output may include, for example, an output argument that is passed from a called element (e.g., a function) to a caller element (e.g., a function caller). Thus, the passed output may represent an output argument of a function (e.g., $Arg_{out}$).

Additionally, or alternatively, the function prototype may identify a data type of the passed input and/or the passed output (e.g., a single-precision scalar, an 8-bit integer scalar, a 32-bit integer scalar, a double, a vector, etc.), a size of the passed input and/or the passed output (e.g., a quantity of scalars, a length of a vector, etc.), a complexity of the passed input and/or the passed output (e.g., whether the passed input and/or the passed output is a real number, an imaginary number, a combination of real and imaginary numbers, etc.), or the like.

In some implementations, the function prototype may include a sample rate indicator. The sample rate indicator may indicate a sample rate at which to call the called element. For example, assume that the called element is capable of executing five times per second. In that case, the sample rate indicator may indicate to call the called element, from the caller element, at a sample rate of five calls per second or less. In some implementations, the sample rate indicator may indicate that the sample rate is to be inherited. In this case, client device 210 may determine the sample rate based on the called element (e.g., based on information associated with the called element, by executing the called element and recording the sample rate associated with the called element, or the like).

In some implementations, the called element may be a same type of element as the caller element (e.g., the caller element and the called element may both be a block in a graphically-based modeling environment). In some implementations, the called element may be a different type of element than the caller element (e.g., the caller element may be a block in a graphically-based modeling environment, and the called element may be a program code function in a text-based modeling environment). As an example, the caller element may include a function caller (e.g., a function caller in a text-based modeling environment, such as a MATLAB function caller, a C function caller, etc.; a function caller in a graphically-based modeling environment, such as a Simulink function caller block, an AUTOSAR client, etc.; a function caller in a state-based modeling environment, such as a Stateflow function call, etc.), an object (e.g., a function caller object), a block (e.g., a function caller block), a subsystem, an AUTOSAR element (e.g., an AUTOSAR client), a Common Object Request Broker Architecture (CORBA) element, a Unified Modeling Language (UML) element, a system modeling language (SysML) element, or the like. As another example, the called element may include a function (e.g., a function in a text-based modeling environment, such as a MATLAB function, a C function, etc.; a function in a graphically-based modeling environment, such as a Simulink function, an AUTOSAR server, etc.; a function in a state-based modeling environment, such as a Stateflow graphical function, etc.), an object (e.g., a function object), a block (e.g., a function block), a subsystem, an AUTOSAR element (e.g., an AUTOSAR server), a CORBA element, a UML element, a SysML element, or the like.

In some implementations, the called element may be associated with a same type of modeling environment as the caller element (e.g., the caller element and the called element may both be included in graphical models of a time-based block diagram modeling environment, such as Simulink). In some implementations, the called element may be associated with a different type of modeling environment than the caller element (e.g., the caller element may be associated with a time-based block diagram modeling environment, such as Simulink, and the called element may be associated with a text-based modeling environment, such as MATLAB). A modeling environment type may include, for example, a text-based modeling environment (e.g., a text-based programming environment, a MATLAB environment, a C environment, etc.), a graphically-based modeling environment (e.g., a Simulink environment), a state-based modeling environment (e.g., a Stateflow environment), a hybrid modeling environment (e.g., that includes two or more of a text-based modeling environment, a graphically-based modeling environment, a state-based modeling environment, etc.), or the like. For example, a called element of a graphically-based modeling environment (e.g., a Simulink function) may be called by a caller element of a state-based modeling environment (e.g., a Stateflow function call) and/or a text-based modeling environment (e.g., a MATLAB function caller).

In some implementations, a function prototype may be included in function information. Function information may refer to a function prototype or other information that identifies one or more passed inputs and/or one or more passed outputs associated with the called element.

As further shown in FIG. 5, process 500 may include receiving information that identifies one or more internal inputs and/or one or more internal outputs associated with the called element (block 520). For example, client device 210 may receive information that identifies one or more internal inputs and/or one or more internal outputs of the called element. An internal input may refer to an input that is received by the called element from another element within the called model that includes the called element. An internal output may refer to an output that is provided by the called element to another element within the called model that includes the called element. In other words, the internal input may be an input received by the called element from an element other than the caller element, and the internal output may be an output provided by the called element to an element other than the caller element.

As an example, the internal input may be received by the called element via an input port (e.g., of a block), such as when the called element is included in a graphically-based modeling environment. Similarly, the internal output may be provided by the called element via an output port (e.g., of a block), such as when the called element is included in a graphically-based modeling environment. As another example, the internal input may be received by the called element from a parent element (e.g., a parent chart), such as when the called element is included in a state-based modeling environment. Similarly, the internal output may be provided by the called element to a parent element (e.g., a parent chart), such as when the called element is included in a state-based modeling environment. In some implementations, the called element may not have an internal input and/or an internal output (e.g., when the called element is included in a text-based modeling environment). Thus, the internal input and the internal output, as well as the passed input and the passed output, may be represented using different representations based on a type of modeling environment in which these elements are included (e.g., different representations of mathematical expressions for different types of modeling environments).

In some implementations, the called element may use an internal input (e.g., one or more input values) to determine an internal output (e.g., one or more output values). In some implementations, the called element may generate a passed output based on the internal output, and may provide the passed output to the caller element. Additionally, or alternatively, the called element may provide the internal output to an element of a called model that includes the called element.

In some implementations, the function prototype may define an internal output as a passed output, indicating that the called element is to provide the internal output as a passed output to the caller element. In such implementations, client device 210 may provide the internal output to the caller element (e.g., for display, for the caller element to provide to an element of the caller model, or the like). In this way, client device 210 may permit a caller element to receive information related to a called model, that does not include the caller element, without executing the entire called model.

As further shown in FIG. 5, process 500 may include generating the caller element, for calling the called element from the caller model, based on the function prototype (block 530). For example, client device 210 may generate the caller element based on the function prototype. The caller element may be associated with one or more passed inputs and/or one or more passed outputs defined by the function prototype. The caller element, when executed, may call the called element based on a function identifier or another called element identifier of the called element. In some implementations, client device 210 may generate the caller element by creating an element for the caller element, such as a block in a block diagram model, a function caller in a textual programming environment, a function call in a state-based modeling environment, or the like. Additionally, or alternatively, client device 210 may include the caller element in a caller model.

In some implementations, client device 210 may generate the caller element by generating code for the caller element. For example, client device 210 may generate code for the caller element based on the function prototype. Additionally, or alternatively, client device 210 may generate code for the caller element based on information that identifies one or more passed inputs associated with the caller element, based on information that identifies one or more passed outputs associated with the caller element, based on an operation (e.g., a task) performed by the caller element, or the like.

Additionally, or alternatively, client device 210 may generate a block for the caller element, may generate an intermediate representation for the caller element, or the like. In some implementations, when client device 210 generates a block for the caller element, client device 210 may store the block in a block library for later reuse.

As further shown in FIG. 5, process 500 may include determining the called element based on the function prototype, the one or more internal inputs, and/or the one or more internal outputs (block 540). For example, client device 210 may determine the called element based on the function prototype, the one or more internal inputs, and/or the one or more internal outputs, as described above in connection with FIGS. 4B and 4C.

In some implementations, client device 210 may determine the called element by locating the called element (e.g., based on a function identifier included in the function prototype), as described above in connection with FIG. 4B. For example, client device 210 may locate the called element by searching (e.g., using the function identifier) a file, a folder, a model, etc. that stores information associated with called elements.

In some implementations, client device 210 may locate the called element based on a scope identified by the caller element and/or the function prototype. The scope may identify a locality (e.g., one or more models, sub-models, modeling environments, a private scope, a public scope, etc.) within which to locate the called element. For example, assume that a caller element calls a called element with a function identifier of "timestwo." Assume further that the caller element defines a scope of a particular model and/or a particular modeling environment (e.g., a scope of the called model, a scope of another model, a scope of the called model and one or more other models, etc.). Based on the scope, client device 210 may attempt to locate the called element within the particular model and/or modeling environment. In this way, client device 210 may determine a called element based on a scope, which may be advantageous when multiple called elements share a function identifier, when restricting the called element to a particular model and/or modeling environment, to conserve computing resources when searching for the called element, or the like.

In some implementations, client device 210 may determine the called element by generating the called element, as described above in connection with FIG. 4C. In some implementations, client device 210 may generate the called element after failing to locate a called element that matches the function identifier included in the function prototype. In some implementations, client device 210 may generate a template that includes a particular quantity of passed inputs and/or passed outputs determined based on the function prototype. Client device 210 may provide the template (e.g., for display), and may receive user input that defines operations, etc., for the called element to perform.

In some implementations, client device 210 may generate code for the called element. For example, client device 210 may generate code for the called element based on a function prototype. Additionally, or alternatively, client device 210 may generate code for the called element based on information that identifies one or more passed inputs associated with the called element, based on information that identifies one or more passed outputs associated with the called element, based on information that identifies one or more internal inputs associated with the called element, based on information that identifies one or more internal outputs associated with the called element, based on an operation (e.g., a task) performed by the called element or the like. In some implementations, when client device 210 generates a block for the called element, client device 210 may store the block in a block library for later reuse.

In some implementations, the code generated for the called element may be a different type of code than the code generated for the caller element. For example, the generated code for the caller element may be MATLAB code, and the generated code for the called element may be C code. In some cases, client device 210 may generate a different type of code for the caller element and the called element when the caller element and the called element are included in different models, different modeling environments, different programming environments, or the like. Additionally, or alternatively, client device 210 may generate a block for the called element, may generate an intermediate representation for the called element, or the like.

In some implementations, client device 210 may generate code for the called element based on code generated for the caller element. For example, the code for the caller element may include code for a function caller, and client device 210 may use the code for the function caller to generate code for a function that corresponds to the called element. In some implementations, client device 210 may generate code for the called element and the caller element independently. For example, client device 210 may generate code for the called element based on a function prototype, passed input(s), passed output(s), internal input(s), internal output(s), and/or operation(s), without using the code generated for the caller element.

As further shown in FIG. 5, process 500 may include providing and/or storing information that identifies the called element (block 550). For example, client device 210 may provide and/or store information that identifies the called element. In some implementations, client device 210 may store the information locally. Additionally, or alternatively, client device 210 may provide the information to another device for storage (e.g., server device 230, or the like).

In some implementations, client device 210 may store information associated with the called element using syntax that is not specific to any particular type of model and/or modeling environment (e.g., using neutral syntax). For example, client device 210 may store (e.g., in a catalog, a data structure, etc.) a name associated with the called element (e.g., a function identifier), may store a pointer that points to the called element (e.g., a function pointer), and may store a relationship indicator that indicates a relationship between the name and the pointer. The caller element may use the name to pass information to the called element (e.g., using the pointer). Thus, a caller element included in a first type of model and/or modeling environment may call the called element without requiring interpretation to a syntax of a call associated with a second type of model and/or modeling environment. This permits cross-domain (e.g., cross-modeling environment) interaction between caller elements and called elements. Additionally, or alternatively, passed data (e.g., a passed input and/or a passed output) may be modeled graphically, rather than by using a pointer.

In some implementations, client device 210 may store information that identifies caller elements and called elements in different models and/or modeling environments, and information that identifies relationships between the caller elements and the called elements (e.g., a hierarchy of caller elements to called elements). Additionally, or alternatively, client device 210 may store attributes associated with the caller elements and/or the called elements. For example, client device 210 may store information that identifies an operation (e.g., a task) within which a caller element executes. As another example, client device 210 may store information that identifies one or more operations within which a called element executes. In some cases, operations associated with a called element may be a union of all operations associated with caller elements that call the called element. Based on the operation(s) associated with a called element, client device 210 may determine task transitions associated with internal input(s) and/or internal output(s) of the called element, and may identify mechanisms needed to ensure data integrity of the internal input(s) and/or internal output(s).

In some implementations, client device 210 may determine operation(s) associated with the called element after all of the caller elements, that call the called element, have been modeled within a model hierarchy. A model hierarchy may refer to a set of models that have a dependency, such as a caller model and a called model that is called by the caller model. Additionally, or alternatively, client device 210 may determine operation(s) associated with the called element after all operations of the caller elements (e.g., in legacy code) have been determined.

In some cases, client device 210 may generate code for the called element before all of the caller elements, that call the called element, have been modeled and/or have had code generated. In this case, client device 210 may generate code for the called element that employs calls to data access methods to communicate internal inputs and/or internal outputs. This may assist with ensuring data integrity. In some implementations, the internal input and/or the internal output may be implemented as global data (e.g., global to the called model, global across multiple models, etc.), as one or more access methods, or the like. Client device 210 may then determine the implementations of the data access methods after determining all caller elements that call the called element.

In some implementations, client device 210 may generate code for one or more of the caller element, the called element, the passed input(s), the passed output(s), the internal input(s), the internal output(s), the function prototype, or the like. Additionally, or alternatively, client device 210 may store the code, and/or may execute the code. In some implementations, code for the called element may be in a same programming language as code for the caller element. In some implementations, code for the called element may be in a different programming language than code for the caller element.

In some implementations, the client device 210, or a different device that interacts with the caller and/or called elements, can use a code generator to generate code for the caller element, the called element, the function interface between the caller element and the called element, and/or other features associated with caller or called element. Examples of the other features include, e.g., passed input/output (I/O) ports, I/O variables, in-out ports/variables and/or internal ports/variables within a local environment of the called element. The other features for which code is generated can also include various data access methods implemented by underlying functions of the called elements, including direct access and indirect access. For example, the underlying functions are described in a model language for performing desired functionalities.

In some implementations, an in-out variable/port is a variable that is both an input and an output of a function. Features of the called element may be external with respect to the calling element. When features are external to an element, the element may not be able to access and/or interact with the features. For example, a called element may have one or more I/O ports, I/O variables, and/or in-out ports/variables; internal ports/variables of a local environment of the called element; and data access methods that are external with respect to the caller element.

When generating code, semantics of the caller/called elements are translated into code, e.g., C code, C++ code, Ada code, or other code. In some implementations, code is generated in compliance with various coding standards, such as the AUTOSAR software architecture standard. In addition, in generating the code, function prototypes can be controlled to comply with predetermined rules, e.g., user-specified rules.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

FIGS. 6A-6D are diagrams of an example implementation 600 of calling and executing a called element using a caller element. For the purpose of FIGS. 6A-6D, assume that client device 210 stores information identifying a caller element 605 and a called element 610. Assume further that caller element 605 is included in a caller model 615, that the called element 610 is included in a called model 620, and that caller model 615 and called model 620 are separately and independently executable models. In some implementations, the operations described in connection with FIGS. 6A-6D may be performed by another device or a group of devices separate from or including client device 210, such as server device 230.

Figure 6A:
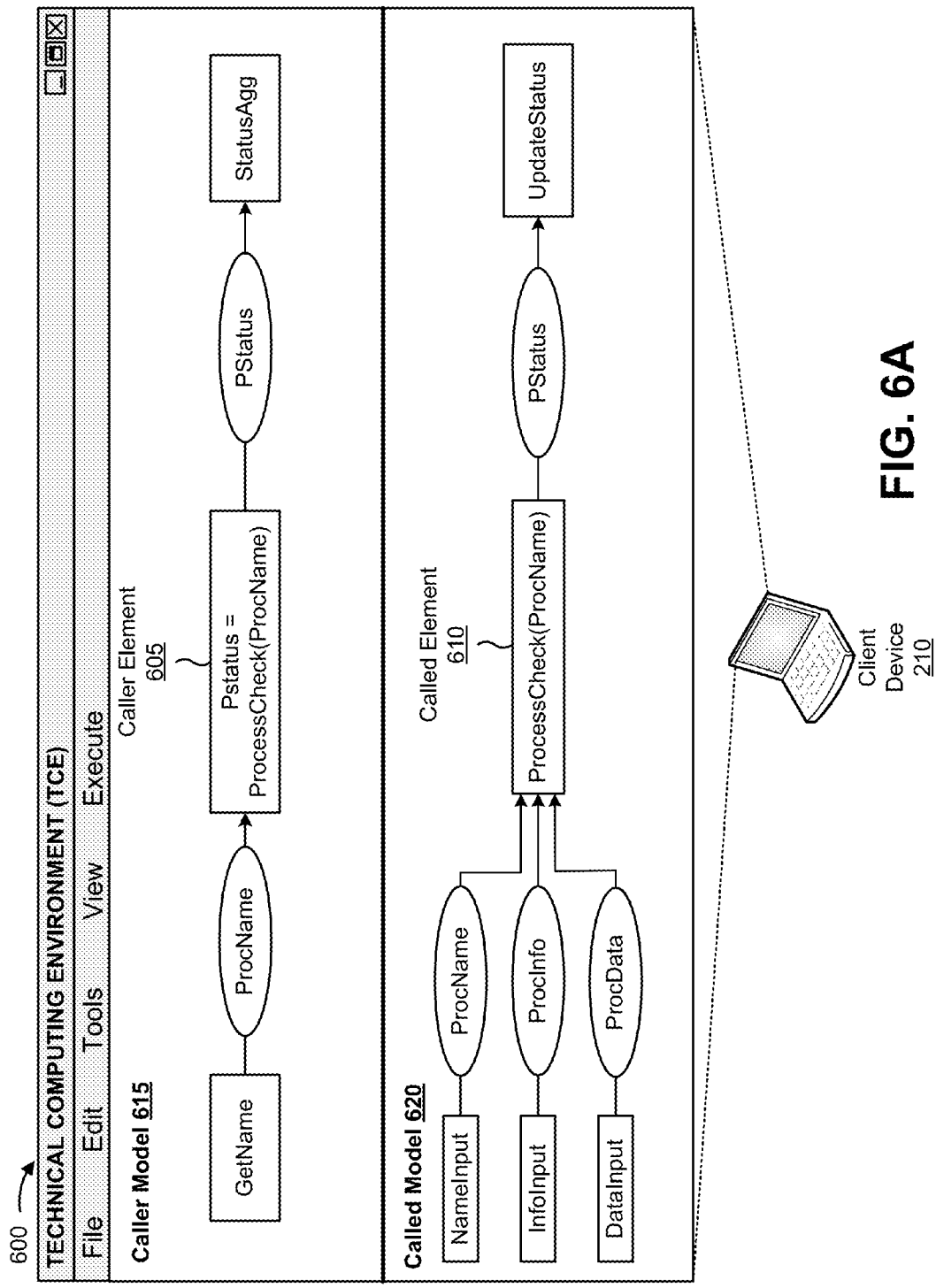

As shown in FIG. 6A, client device 210 may provide a TCE that permits communication between caller model 615 and a portion of called model 620. As shown, caller model 615 may include caller element 605. As further shown, caller element 605, shown as Pstatus=ProcessCheck(ProcName), may receive an input variable (e.g., ProcName) from a GetName element included in caller model 615, and may provide an output variable (e.g., PStatus) to a StatusAgg element included in caller model 615.

As further shown in FIG. 6A, called model 620 may include called element 610. Called element 610, shown as ProcessCheck(ProcName), may receive three input variables (e.g., ProcName, ProcInfo, and ProcData) from three respective elements (e.g., NameInput, InfoInput, and DataInput) included in called model 620. Called element 610 may process the three input variables to generate an output variable (e.g., PStatus), and may provide the output variable to an UpdateStatus element included in called model 620. Thus, as shown, caller model 615 and called model 620 may be independently executable.

As shown in FIG. 6B, assume that a user interacts with client device 210 to cause caller model 615 to execute. During execution, assume that the GetName element generates and passes the ProcName variable to caller element 605. Further, assume that caller element 605 executes, which causes the ProcName variable to be passed to called element 610 as a passed input 625. Assume that called element 610 receives passed input 625 (e.g., the ProcName variable) from caller element 605, which causes called element 610 to execute without executing other elements of called model 620. Execution of called element 610 may cause called element 610 to process passed input 625 to generate a passed output 630 (e.g., the PStatus variable), and to provide passed output 630 to caller element 605. Caller element 605 may receive the PStatus variable as passed output 630, and may execute to provide the PStatus variable to another element of caller model 615, shown as StatusAgg. The StatusAgg element may execute by performing an operation using the PStatus variable. In this way, caller model 615 may execute, and may cause execution of a portion of called model 620 (e.g., called element 610) without causing execution of all of called model 620.

In some implementations, called element 610 may execute based solely on passed input 625 (e.g., the ProcName variable), received from caller element 605, to generate passed output 630 (e.g., the PStatus variable). In some implementations, called element 610 may execute using passed input 625 and one or more internal inputs 635, received from one or more other elements of called model 620, to generate passed output 630. For example, execution of caller element 605 may cause execution of the InfoInput element, which provides a ProcInfo internal input 640 to called element 610, and the DataInput element, which provides a ProcData internal input 645 to called element 610. Called element 610 may use the ProcInfo internal input 640, the ProcData internal input 645, and the ProcName passed input 625 to generate the PStatus passed output 630. In this case, execution of caller element 605 still causes execution of a portion of called model 620, without causing execution of the entire called model 620, thereby conserving processing resources.

While FIGS. 6A and 6B show the caller element and the called element as elements of a same type of modeling environment (e.g., a graphically-based modeling environment), the caller element and the called element may be elements of different types of modeling environments. For example, FIG. 6C shows the caller element as an element of a graphically-based modeling environment, and shows the called element as an element of a text-based modeling environment.

As shown in FIG. 6C, when caller element 605 is executed in the graphically-based modeling environment, caller element 605 may provide passed input 625 (e.g., ProcName) to called element 610, which may be a function in the text-based modeling environment (e.g., a ProcessCheck function). Called element 610 (e.g., the ProcessCheck function) may execute, may generate a value for a PStatus variable, and may provide the value to caller element 605 as passed output 630. As shown, called model 620 (e.g., a text-based program) may include other code (shown as //code) that is not executed when caller element 605 calls called element 610 of called model 620. In this way, caller element 605 may access and obtain information from called element 610 included in a different modeling environment than caller element 605, without causing execution of the entire called model 620. Thus, client device 210 may conserve processing resources and may permit cross-domain interaction.

As shown in FIG. 6D, a single called element 610 may be called by multiple caller elements, such as a first caller element 605 and a second caller element 650. In some implementations, different caller elements may be included in the same model and/or the same modeling environment. In some implementations, different caller elements may be included in different models. Additionally, or alternatively, different caller elements may be included in different modeling environments (e.g., a first caller element may be included in a text-based modeling environment, a second caller element may be included in a graphically-based modeling environment, a third caller element may be included in a state-based modeling environment, etc.). For the purpose of FIG. 6D, assume that caller element 605 and caller element 650 are included in the same model, shown as caller model 615.

As shown, when caller model 615 is executed, first caller element 605 may execute, and may provide a first passed input 625 to called element 610. Called element 610 may execute to operate on first passed input 625, and may generate a first passed output 630 provided to caller element 605.

Caller model 615 may continue to execute (e.g., by executing an UpdateProcName element), and may execute second caller element 650. Execution of second caller element 650 may cause a second passed input 655 to be provided to called element 610. Called element 610 may execute to operate on second passed input 655, and may generate a second passed output 660 provided to second caller element 650. Caller model 615 may use second passed output 660 for further execution, such as for execution of the StatusAgg element. In this way, called element 610 may support multiple caller elements, thereby conserving computing resources.

As further shown in FIG. 6D, in some implementations, a user may interact with an input mechanism 665 to require called element 610 to be reentrant. By requiring called element 610 to be reentrant, client device 210 may prevent errors due to multiple calls to called element 610 when called element 610 is associated with internal state information that may be overwritten by calls from multiple caller elements. In this case, client device 210 may return an error if called element 610 includes internal state information and is called by multiple caller elements. In this way, client device 210 may prevent incorrect data from being passed from a called element to a caller element.

As indicated above, FIGS. 6A-6D are provided as an example. Other examples are possible and may differ from what was described with regard to FIGS. 6A-6D.

Figure 7:
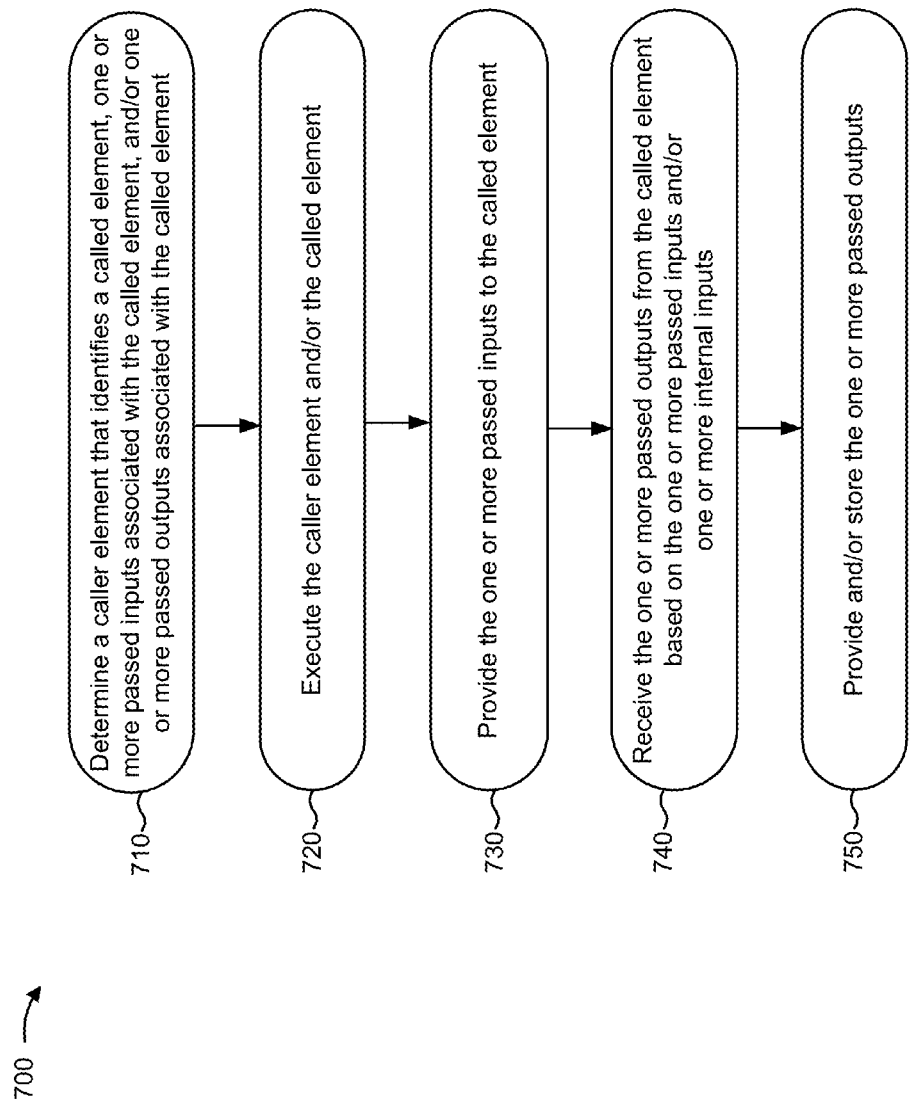
FIG. 7 is a flow chart of an example process for calling and executing a called element using a caller element.

FIG. 7 is a flow chart of an example process 700 for calling and executing a called element using a caller element. In some implementations, one or more process blocks of FIG. 7 may be performed by client device 210. In some implementations, one or more process blocks of FIG. 7 may be performed by another device or a set of devices separate from or including client device 210, such as server device 230.

As shown in FIG. 7, process 700 may include determining a caller element that identifies a called element, one or more passed inputs associated with the called element, and/or one or more passed outputs associated with the called element (block 710). For example, client device 210 may determine a caller element, as described above in connection with FIG. 6A. The caller element may identify a called element, one or more passed inputs to be passed to the called element, and/or one or more passed outputs to be passed from the called element. In some implementations, client device 210 may determine the caller element based on a function prototype. Additionally, or alternatively, client device 210 may load a caller model that includes the caller element.

In some implementations, a model may include multiple caller elements that call a particular called element. The multiple caller elements may include information related to a relative priority of caller elements. For example, the information may indicate whether the called element can be executed by multiple caller elements concurrently, whether the called element is executed sequentially based on a calling priority of the caller elements, or the like. Client device 210 may queue, prioritize, concurrently execute, etc., the caller elements, as described in more detail below.

As further shown in FIG. 7, process 700 may include executing the caller element and/or the called element (block 720). For example, client device 210 may execute the caller element, as described above in connection with FIG. 6B. Based on executing the caller element, client device 210 may call and/or execute the called element referenced by the caller element. In some implementations, client device 210 may execute the called element locally. In some implementations, client device 210 may cause another device to execute the called element. For example, if the called element is stored by another device (e.g., server device 230), client device 210 may cause the other device to execute the called element.

In some implementations, client device 210 and/or server device 220 may execute the caller element by executing code that has been generated for the caller element. Similarly, client device 210 and/or server device 220 may execute the called element by executing code that has been generated for the called element. Additionally, or alternatively, client device 210 and/or server device 220 may execute the caller element by executing a block generated for the caller element, by executing an intermediate representation generated for the caller element, or the like. Similarly, client device 210 and/or server device 220 may execute the called element by executing a block generated for the called element, by executing an intermediate representation generated for the called element, or the like.

In some implementations, client device 210 may determine a relative age of code associated with the caller element and the called element to ensure compatibility between older code and newer code. For example, assume that a called element is associated with older code. Assume further that a caller element is associated with newer code. Client device 210 may determine a relative age of the caller element and the called element based on the ages of the older code and the newer code, and may process information passed between the caller element and the called element based on the relative age. This may assist client device 210 in ensuring that passed inputs and passed outputs, passed between the caller element and the called element, are not corrupted by inappropriate data formatting methods.

In some implementations, client device 210 may execute the caller element and/or the called element based on a conflict rule. A conflict rule may specify a rule for selecting a called element to execute in case of a conflict between two or more called elements. A conflict may occur when client device 210 locates two or more called elements that share a function identifier. Client device 210 may apply a conflict rule to resolve the conflict. For example, the conflict rule may specify execution of a called element that includes passed inputs and/or passed outputs that match the caller element. Additionally, or alternatively, client device 210 may select a called element to execute based on a scope of the conflicting called elements. Client device 210 may select a called element to execute based on the conflict rule, which may reduce or eliminate an impact of a conflict between called elements.

In some implementations, client device 210 may execute the caller element and/or the called element based on a scope-based rule. A scope-based rule may cause execution of one or more of multiple conflicting called elements based on a scope associated with the multiple conflicting called elements. For example, assume that a caller element calls a called element with a function identifier of "timestwo." Assume further that a first called element and a second called element share the function identifier of "timestwo." Assume that the first called element and the caller element are both associated with a first modeling environment. Assume further that the second called element is associated with a second modeling environment. Based on a scope-based rule, client device 210 may execute the first called element (e.g., based on the first called element and the caller element being associated with the same modeling environment). In some implementations, the scope-based rule may prioritize a particular model and/or modeling environment, a caller element within the same model and/or modeling environment as a called element, a caller element in a different model and/or modeling environment, or the like. In this way, client device 210 may decrease errors and/or inconsistencies when executing called elements by enforcing a scope-based rule.

In some implementations, client device 210 may queue execution of a called element. For example, multiple caller elements may call a called element (e.g., simultaneously, concurrently, in quick succession, etc.). However, the called element may be incapable of executing based on the multiple caller elements. Client device 210 may queue execution of the called element based on the multiple caller elements (e.g., based on a priority associated with the multiple caller elements, based on an order in which passed inputs from the multiple caller elements are received by the called element, etc.) to allow the called element to execute based on calls from the multiple caller elements. In this way, client device 210 may prevent a called element from generating an error or incorrect output based on multiple calls from caller elements.

In some implementations, the caller element may specify that the called element is capable of concurrent execution (e.g., is a reentrant element that does not store internal state information). For example, assume that multiple caller elements call a called element. Assume further that two or more of the multiple caller elements may call the called element concurrently. In that case, the multiple caller elements may specify that the called element is capable of concurrent execution (e.g., based on user input). That is, the multiple caller elements may specify that the called element is capable of executing based on two or more concurrent calls, and may provide concurrent passed outputs to the two or more caller elements. In this way, the multiple caller elements may indicate to client device 210 to allow multiple concurrent calls of a particular called element, rather than delaying concurrent calls, queuing concurrent calls, or the like.

In some implementations, client device 210 may require the called element to be concurrently invocable (e.g., to be capable of being called by more than one caller element concurrently). For example, a user may provide input to require the called element to be concurrently invocable. In this case, the called element may have multiple client invocations per thread, across different threads, etc., and the real-time functionality of the called element (e.g., code of the called element) will match simulation, even if one caller element preempts another caller element. In some implementations, if the called element is concurrently invocable, client device 210 may prevent the called element from accessing persistent data, and may return an error if the called element accesses persistent data. In this way, client device 210 may prevent incorrect data from being passed from a called element to a caller element.

In some implementations, the called element may be a non-reentrant element that stores internal state information. In this case, if the called element is called by multiple caller elements concurrently, each call may overwrite the internal state information, which may cause undesired interference between the multiple callers. In some implementations, the called element may be a reentrant element that does not store internal state information. In some implementations, client device 210 may receive user input (e.g., via an input mechanism) that requires the called element to be a reentrant element. In this case, if multiple concurrent calls are made to the called element, client device 210 may generate and/or provide an error message. Additionally, or alternatively, if the called element is a reentrant element, client device 210 may generate and/or provide an error message if the called element stores internal state information that may be overwritten by a call from a caller element. In this way, client device 210 may prevent incorrect data from being passed from a called element to a caller element.

In some implementations, the caller element may be an element of a model, and the called element may be a component of a physical system (e.g., a processor in the loop, a system in the loop, etc.). In this way, a model may interact with a component of a physical system without causing the entire physical system to run. In some implementations, the caller element may be a component of a physical system, and the called element may be an element of a model. In this way, the physical system may interact with an element of a model without causing the entire model to execute. Additionally, or alternatively, the caller element and/or the called element may be represented and/or executed using an internal representation (e.g., specific to a particular modeling environment, such as a graphical modeling environment), using generated code, using production code, or the like. Additionally, or alternatively, the caller element and/or the called element may be capable of being executed using a particular mode, such as a normal mode, a rapid acceleration mode, or the like.

In some implementations, the caller element may invoke an output update method (e.g., to update an output based on passed output received from the called element), and the called element may invoke all other methods (e.g., a start method, an initialize method, etc.). In this way, the called element may perform processing to generate the passed output, and the caller element may use the passed output to update an output of the caller element (e.g., an output provided to another element of the caller model).

In some implementations, the caller element and the called element may execute asynchronously. In this case, the called element may return a future value, as a passed output, that is used by the called element at a later time.

As further shown in FIG. 7, process 700 may include providing the one or more passed inputs to the called element (block 730). For example, client device 210 may cause the caller element to provide the one or more passed inputs to the called element. The called element may use the one or more passed inputs and/or one or more internal inputs to determine one or more passed outputs. In some implementations, the caller element may directly provide the one or more passed inputs to the called element. In some implementations, the caller element may indirectly provide the one or more passed inputs to the called element (e.g., via one or more intermediary model elements).

In some implementations, client device 210 may provide one or more passed inputs and/or one or more internal inputs to multiple called elements. For example, an internal input may include a globally defined variable that is provided to multiple called elements (e.g., associated with a particular model, associated with a particular modeling environment, being of a particular type, having a particular set of characteristics, etc.). In some implementations, client device 210 may execute a particular caller element that triggers a model-wide event. The model-wide event may provide a passed input to all called elements of a particular model, to a subset of called elements of a particular model, to specified called elements, or the like.

In some implementations, client device 210 may provide a variable quantity of passed inputs. For example, the caller element may receive a passed input that indicates a variable input function. The variable input function may cause the caller element to accept a variable number of passed inputs. In this way, client device 210 may improve versatility of a caller element by providing variable inputs to the caller element.

Additionally, or alternatively, client device 210 may provide one or more default values as passed input to the called element. For example, the called element may accept multiple passed inputs. Some of the multiple passed inputs may be provided by the caller element, and some of the multiple passed inputs may be default values (e.g., not provided by the caller element). In this way, client device 210 may permit the caller element to provide less than a full number of arguments (e.g., passed inputs) to the called element.

In some implementations, client device 210 may generate multiple values for a single passed input. For example, client device 210 may generate values for multiple data types for a particular passed input from the caller element (e.g., a double value, a floating point value, an integer value, etc.). The multiple values may be passed to the called element as passed input, and the called element may select the passed input with the appropriate data type for processing by the called element.

As further shown in FIG. 7, process 700 may include receiving the one or more passed outputs from the called element based on the one or more passed inputs and/or one or more internal inputs (block 740). For example, client device 210 may cause the caller element to receive one or more passed outputs from the called element based on the one or more passed inputs and/or one or more internal inputs, as described above in connection with FIG. 6B. In some implementations, multiple caller elements may receive passed outputs from the called element. For example, if multiple caller elements call the called element, the multiple caller elements may receive a passed output from the called element. In some implementations, the caller element may directly receive the one or more passed outputs from the called element. In some implementations, the caller element may indirectly receive the one or more passed outputs to the called element (e.g., via one or more intermediary model elements).

In some implementations, a passed output may be determined based on an internal input received by the called element from an element included in the same model as the called element (e.g., a called model). For example, assume that a called element receives a pair of internal inputs that define an operational status of a pair of devices, and provides an output of "1" based on the pair of internal inputs (e.g., if the pair of internal inputs indicates that both devices are operational). Assume further that a caller element causes execution of the called element and defines the output as a passed output. In that case, the caller element may receive the output from the called element as a passed output.

As further shown in FIG. 7, process 700 may include providing and/or storing the one or more passed outputs (block 750). For example, client device 210 may provide the one or more passed outputs (e.g., to another element of a caller model that includes the caller element, for display to a user, to another called element, etc.), as described above in connection with FIG. 6B. The called element may be executed independent of the called model, and may provide passed outputs based on internal inputs associated with the called model that includes the called element.

In this way, client device 210 may use the caller element, in a first model, to determine information about a second model that includes the called element, by receiving passed outputs that are determined based on internal inputs included in the called model that includes the called element (e.g., without executing the entire second model).

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Figure 8:
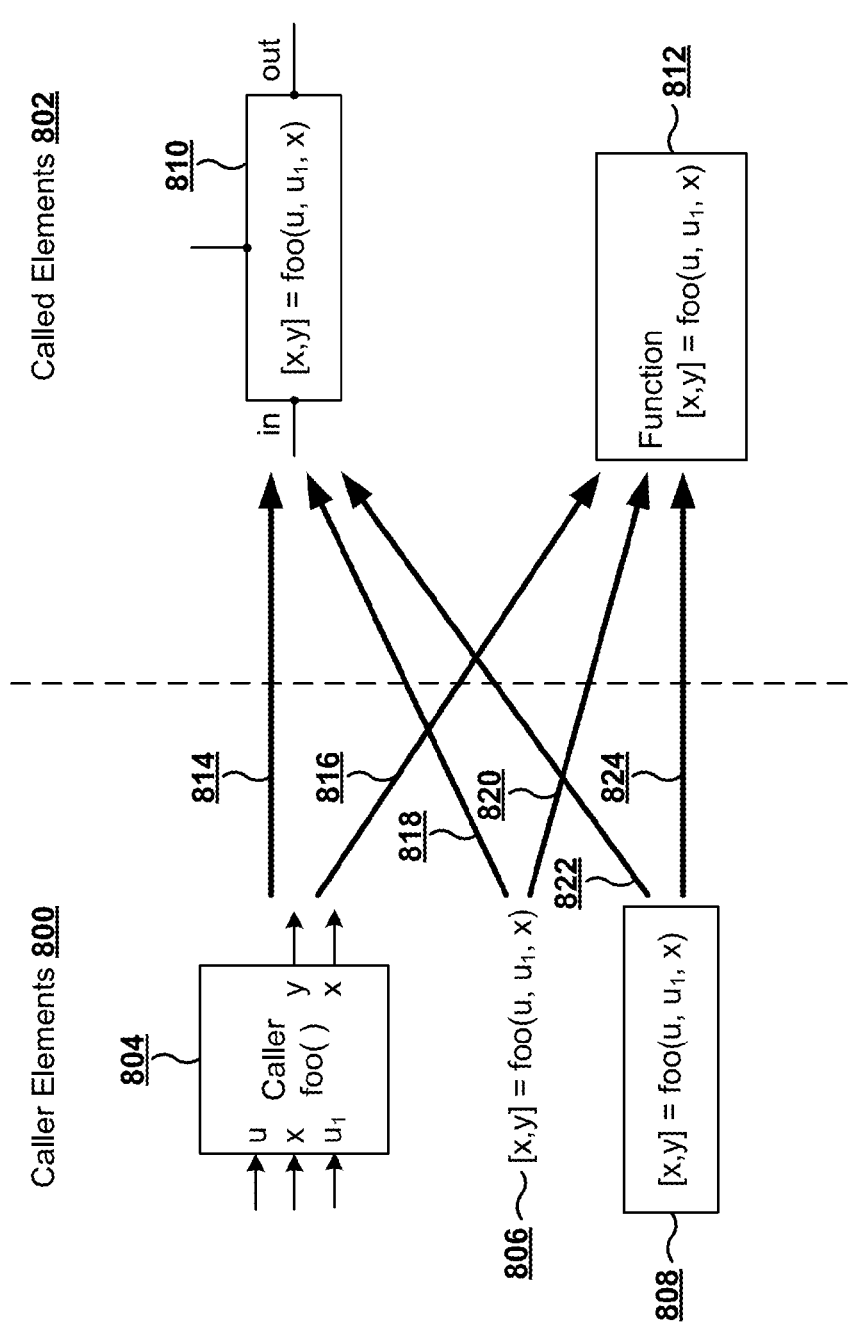
FIG. 8 is a diagram of example caller elements and example called elements.

Referring to FIG. 8, code can be generated for examples of caller elements 800 and called elements 802, and interactions among the elements 800, 802. In FIG. 8, three examples of the caller elements 800 are a function caller block 804, a Stateflow® transition 806, and a line of MATLAB® code in a MATLAB® function block 808. The function caller block 804 can be a Simulink® block. Two examples of the called elements 802 are a Simulink® function block 810 and a Stateflow® graphical function 812. The illustrated examples are intended to be representative and not exhaustive and other examples are possible, such as Simulink-compatible blocks, Stateflow-compatible blocks, other forms of textual programming code, etc. The caller elements 800 and the called elements 802 can be in the same model or in different models.

Each of the caller elements 800 can interact with, e.g., call, each of the called elements 802, through respective function interfaces 814, 816, 818, 820, 822, and 824. A caller element and its corresponding called element can be in the same domain or in different domains. For example, a time-based calling block can call a time-based, state-based, event-based, etc., called block. Referring to FIG. 8, for example, the Simulink® caller block 804 can call the Simulink® function block 810 within the same, Simulink® domain. The Simulink® caller block 804 within the Simulink® domain can also call the Stateflow® graphical function 812 that is in the Stateflow® domain different from the Simulink® domain. Similarly, calls can be made between the Stateflow® domain and the MATLAB® domain or between the MATLAB® domain and the Simulink® Domain.

The calls can be made by matching the function prototype between a calling element and a called element. The following description uses the function caller block 804 and the Simulink® function block 810 as an example, and the description can be applied to other examples of caller elements and called elements discussed herein. In this example, the call through function prototype is performed using a function prototype foo( ) of the function caller block 804 and a function prototype [x,y]=foo (u, $u_1$, x) of the Simulink® function block 810. The function foo( ) has three input ports/variables u, $u_1$, and x and two output ports/variables x and y, which matches the input ports/variables and output ports/variables of the function prototype [x,y]=foo (u, $U_1$, x). Here, x is an in-out port/variable.

Figure 9:
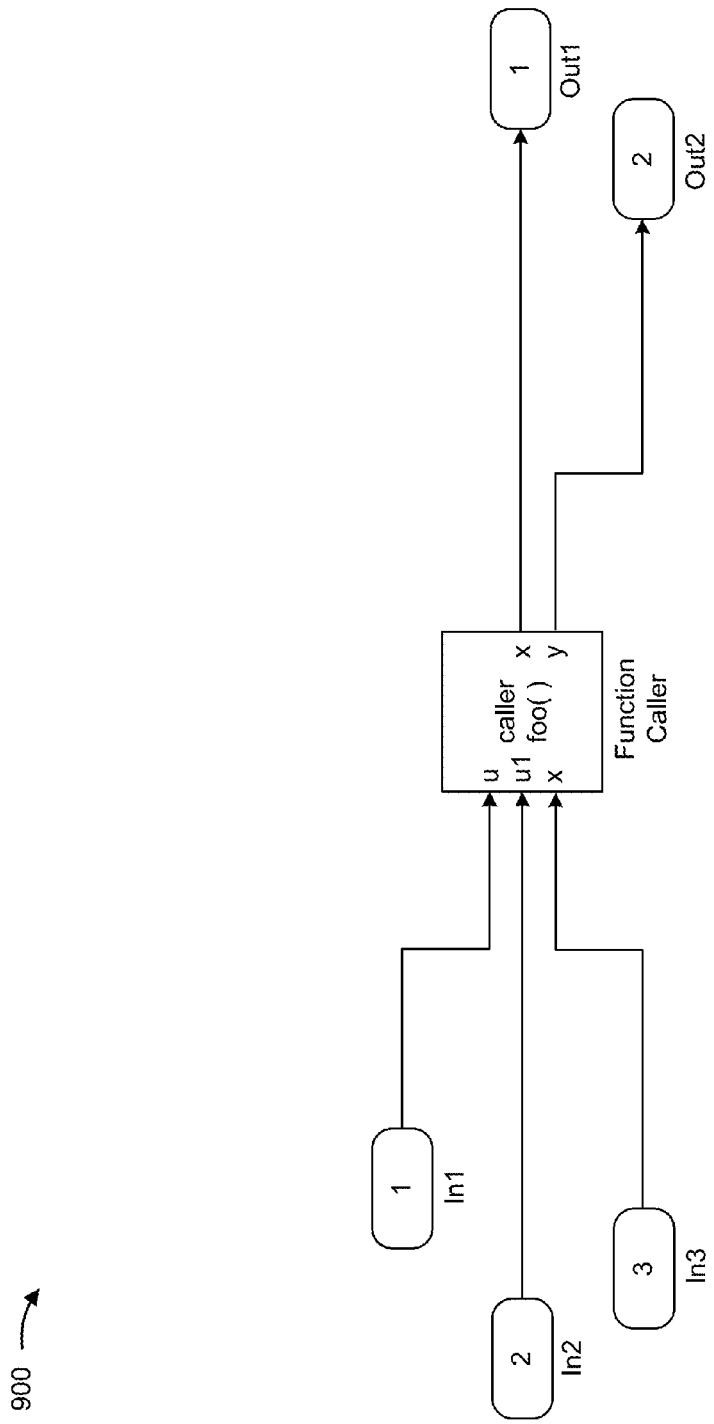
FIG. 9 is a diagram of an example function caller block.

In addition, the call also invokes a local environment of the Simulink® function block 810, which can also be called the function definition. In this example, the definition includes an additional internal input in and an additional internal output out that may be inaccessible by the function caller block 804. An example of a function caller block 900 in a Simulink® model is shown in FIG. 9.

Figure 10:
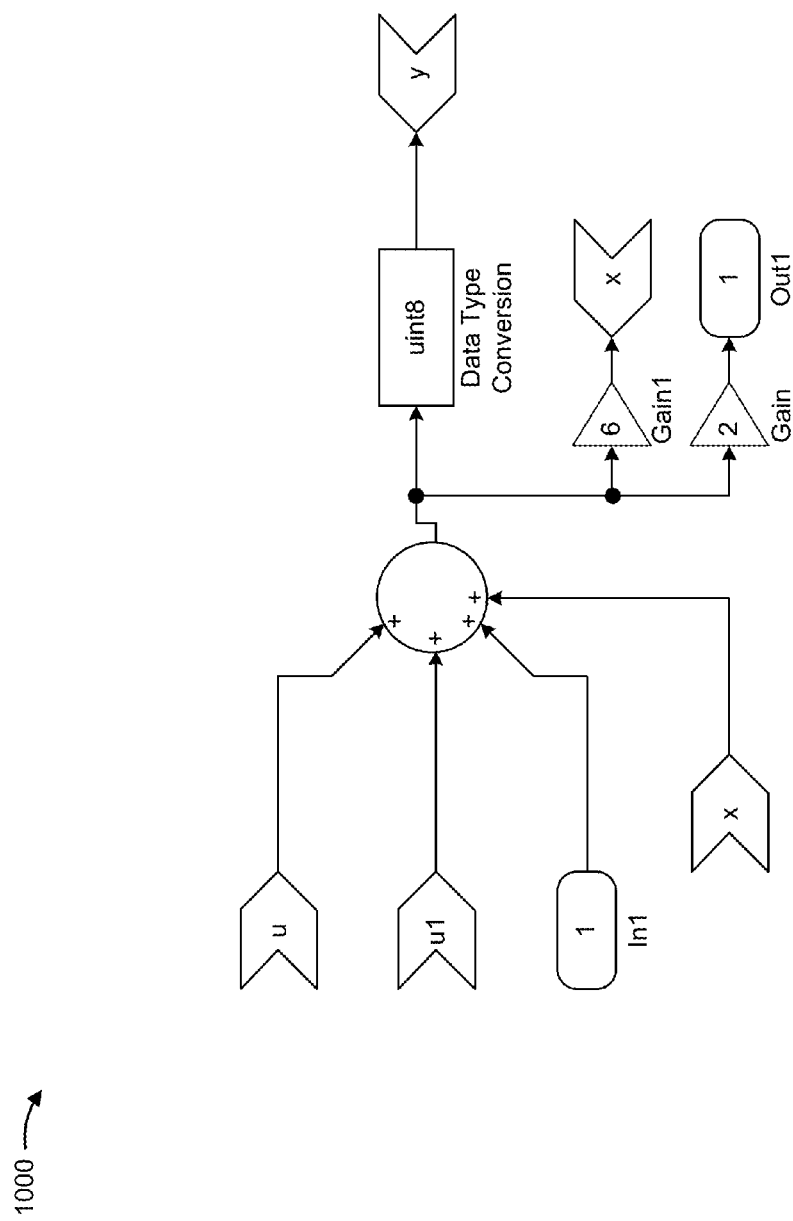
FIG. 10 is a diagram of an example underlying function of a function block.

When calling the Simulink® function block 810, the function caller block 804 passes inputs for the variables/ports u, $u_1$, and x to the called elements, e.g., by value or using pointer(s) to stored values, and requests that the Simulink® function block 810 return outputs for the variables/ports x and y, e.g., by value or using pointer(s) to stored values. Upon being called, the Simulink® function block 810 gathers input data for u, $u_1$, x, in, and out and performs an underlying function (not shown in FIG. 8) [x, y, out]=g (u, $u_1$, x, in). The outputs for x and y are returned to the function caller block 804. An example of the underlying function g in the form of a Simulink® model 1000 is shown in FIG. 10.

The functions and function prototypes described herein are merely examples used for purpose of illustration only. The function caller block 804 and the Simulink® function block 810 can have any function prototype and the underlying function of the Simulink® function block 810 can be any function. The description related to respective examples applies to other function prototypes and functions.

The code generated for the caller and called elements includes code for the function prototypes of a caller element and its corresponding called element. The generated code can also include code for the underlying function of the called element. In some implementations, the call between the caller element and the called element, or the function interface, can be represented by a function in the generated code. The underlying function of the called element can be represented by another function in the generated code. In an example, a declaration can be generated for a function in the generated code based on the function prototype.

Figure 11A:
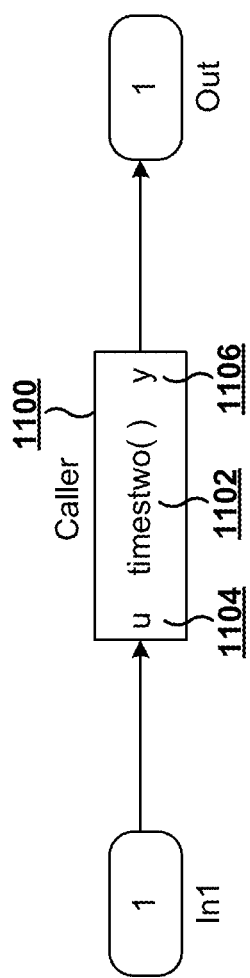
FIGS. 11A and 11B are diagrams of an example function caller block and an associated graphical user interface.
Figure 11B:
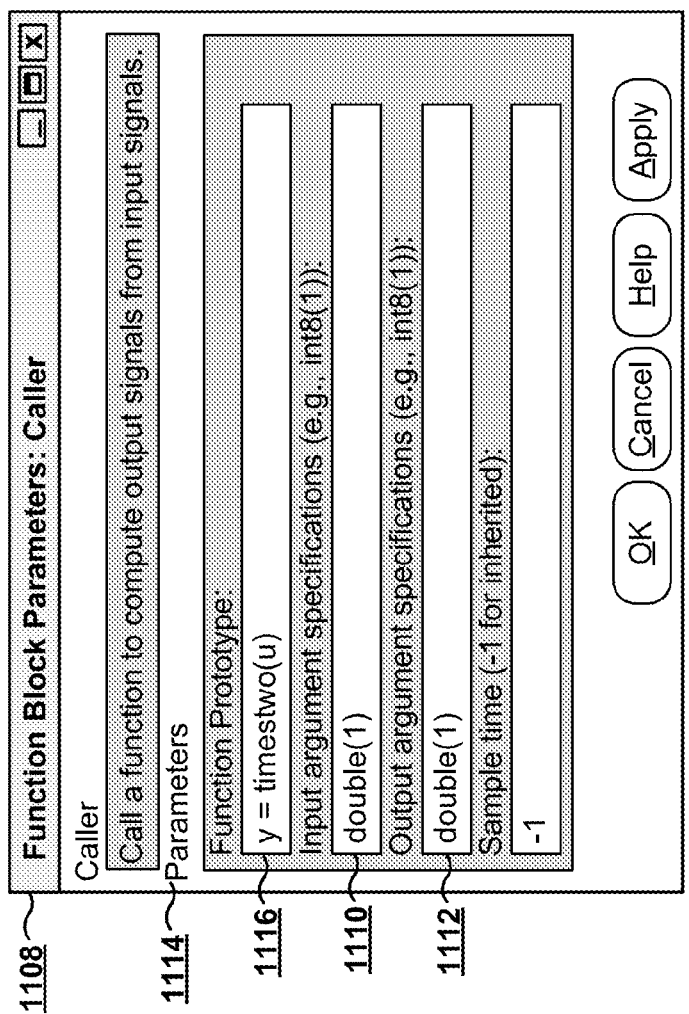

FIGS. 11A and 11B illustrate an example that includes a function caller block 1100 having a function prototype 1102 timestwo( ). The function prototype 1102 has one input variable/port 1104 u, the input data of which will be passed to a called element (not shown in FIGS. 11A and 11B), and one output variable/port 1106 y, the output for which will be received from the caller element.

Referring now to FIG. 11B, in some implementations, a graphical user interface 1108, shown in FIG. 11B, is provided for receiving properties of the function prototype 1102. The graphical user interface 1108 may be accessible from the function caller block 1100, e.g., when the function caller block 1100 is activated by mouse clicking or other user input. The properties can include parameters 1114, including a definition 1116 of the function prototype 1102:

y=timestwo(u), and specifications 1110, 1112 of the input variable/port 1104 and output variable/port 1106. Examples of the specifications include "double," "integer," etc., that define the attributes, e.g., data types, of the input and output variables/ports.

In the example of FIGS. 11A and 11B, the input and output variables/ports both have a data type of double. The function caller block 1100 can call a function block that has the defined prototype 1116. Corresponding to the defined prototype, a declaration is generated based on the properties of the function caller block 1100, including the definition of the function prototype and the specifications for the input and output arguments. For this example, the generated declaration for a function representing the function interface in C code can read:

extern void timestwo(real_T rtu_u, real_T*rty_y).

In addition, the generated declaration for a function in the generated code that represents the call site of the called function can read, timestwo(In1, &Out1).

Figure 12:
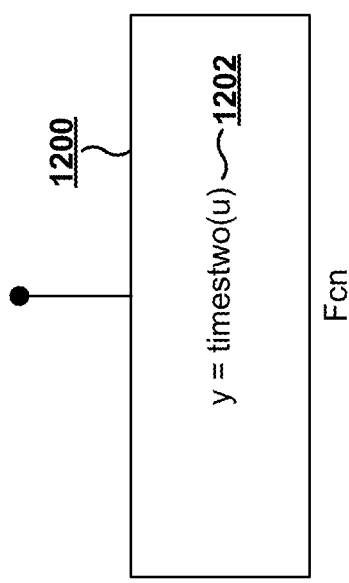
FIG. 12 is a diagram of an example function block.

Referring to FIG. 12, at the call site, a Simulink® function block 1200 includes a function prototype 1202 y=timestwo (u) that matches the function prototype 1102 of FIG. 11A. In some implementations, the declaration for the function interface above can be generated based on the Simulink® function block 1200, instead of being based on the function caller block 1100 of FIG. 11A. In generating code, the sequence in which code is generated for the blocks 1100, 1200 may be dependent on the model(s) that contains the blocks. In some situations code for the block 1100 is generated before code for the block 1200, and in other situations code for the block 1200 is generated before code for block 1100.

In some implementations, the function, e.g., including a declaration, for the function interface can be generated as part of the code generated for the earlier one of the blocks 1100, 1200 for which code is generated and can be shared by the code for both blocks. For example, if the code for the Simulink® function block 1200 is generated before the function caller block 1100, the code generated for the block 1200 includes the function, e.g., including the declaration, for the function interface. Later, when code is generated for the function caller block 1100, the function for the function interface is not re-generated. Instead, the code generated for the function caller block 1100 uses the existing function in code for the function interface. In some implementations, the generated function, e.g., including a declaration, for the function interface can be contained in a code file, e.g., named as f.h, that can be shared by code for different blocks. In some implementations, another function, e.g., including another declaration, for the call site can be contained in another code file, e.g., named as m1.c.

In addition to possibly generating a function including a declaration based on the Simulink® function block 1200, code that defines the underlying function to be executed is generated based on the block 1200. In the example shown in FIG. 12, the underlying function does not include additional internal inputs or outputs that are local to the block 1200 and only includes the input u and the output y that are passed from the function caller block 1100. Accordingly, the generated code that defines the underlying function can be another function and can read:

void timestwo(real_T rtu_u, real_T*rty_y)
{
*rty_y=2.0*rtu_u;
}

In some implementations, these lines of code can be contained in a separate code file, e.g., named as f.c.

As described previously, some called elements have additional internal input(s) and output(s) that are external and inaccessible to the caller elements. These internal input(s) and/or output(s) may access data using different data access methods, e.g., depending on the structure of the model to which the called element is associated. For example, some internal input(s) can obtain data through global direct access, global indirect access, or indirect access. Code generated for different called elements that have the same underlying function, but implement different data access methods, may differ from each other, where the different data access methods are reflected in the generated code.

Figure 13A:
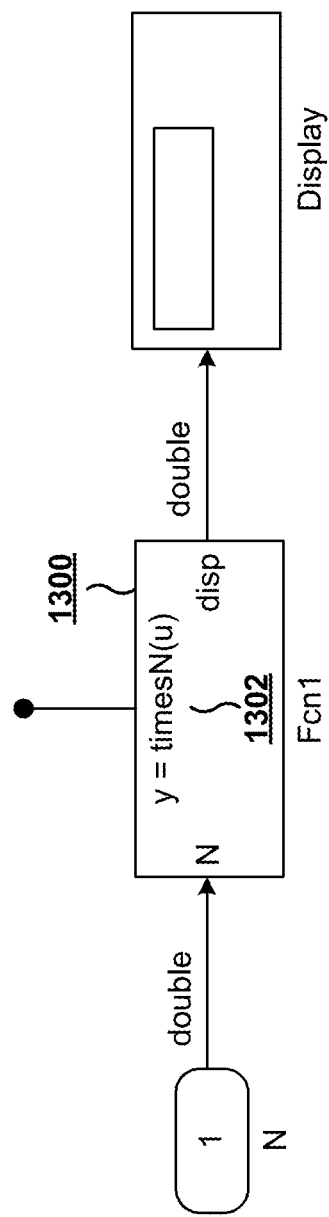
FIGS. 13A-13C are diagrams of example called elements implementing different data access methods.
Figure 13B:
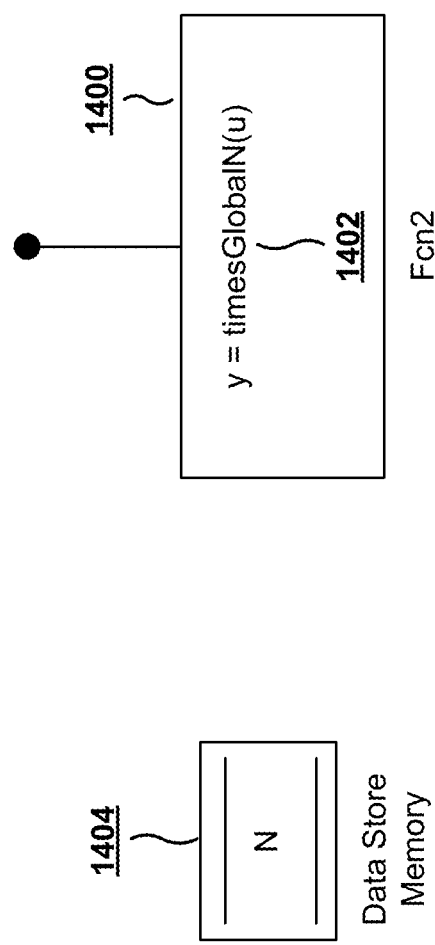
Figure 13C:
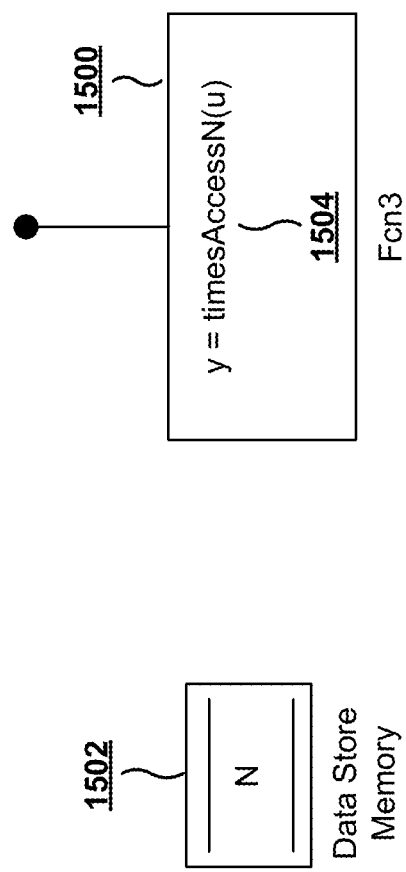

FIGS. 13A, 13B, and 13C show examples of a called element as Simulink® function blocks 1300, 1400, 1500 that have the same underlying function but implement three different data access methods. In particular, referring to FIG. 13A, the block 1300 has a function prototype 1302: y=timesN (u). In addition to the input u and output y that are passed from a corresponding caller element, the block has an additional graphical input N that has a data type of double, and a graphical output disp. The graphical input and output allow the block 1300 to have direct access to global variables u and disp in the model that contains the block 1300. Accordingly, code generated for the block that defines the underlying function can read:

void timesN(real_T rtu_u, real_T*rty_y)
{
*rty_y=rtu_u*mCalled_U.N;
}

Here the variable mCaller_U.N is a variable local to the block 1300 relative to a caller element and is a global variable relative to the model in which the block 1300 is contained.

Referring to FIG. 13B, the block 1400 has a function prototype 1402: y=timesGlobalN(u). In addition to the input u and output y that are passed from a corresponding caller element, the block 1400 has an additional input N. Data for the input N exits within the model in which the block 1400 is contained, e.g., in a data store memory 1404. The block 1400 can access the data for the input N by accessing the memory 1404. Accordingly, the block has indirect access to the global variable N and the code generated for the underlying function of the block 1400 can read:

```
void timesGlobalN(real_T rtu_u, real_T*rty_y)
{
*rty_y=rtu_u*mCalled_DW.N;
}
```

Here, mCaller_DW.N performs a read function that accesses the memory 1404 to obtain the data for the input N.

In the example shown in FIG. 13C, the Simulink® function block 1500 can access data stored in data store memory 1502 indirectly by calling a function accessN( ) that implements a data access method defined by the function accessN( ). The block 1500 has a function prototype 1504: y=timesAccessN (u). In addition to the input u and output y that are passed from a corresponding caller element, the block has an additional graphical input N. Accordingly code generated for the underlying function of the block 1500 can read:

```
void timesGlobalN(real_T rtu_u, real_T*rty_y)
{
*rty_y=rtu_u*mCalled.accessN( )
}
```

Although the caller element, and therefore the code, e.g., function, generated for the caller element, can be called by any number of caller elements or their corresponding code, within the same model or from different models, in some implementations, the caller element is called with few times, e.g., once by one caller element. In such implementations, generating code for the caller and called elements can include generating optimized code inline, e.g., an inline function. In the example discussed with respect to FIG. 13B, the inline function can read:

y=u*mCalled_DW.N

The declaration line "void timesGlobalN(real_T rtu_u, real_T*rty_y)" for the function becomes unnecessary and is not generated. In addition, the declaration line for the function that represents the function interface between the caller element and the called element, e.g., "extern void timestwo (real_T rtu_u, real_T*rty_y)" as described in a previous example, is not generated.

Figure 14:
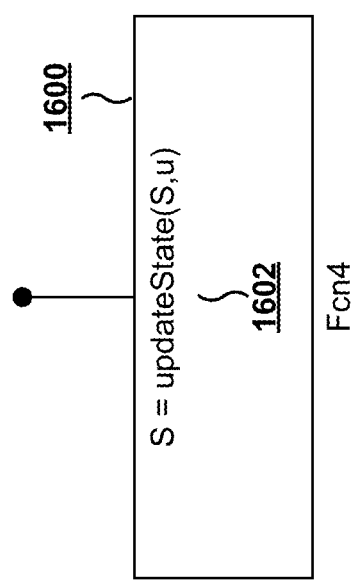
FIG. 14 is a diagram of an example Simulink® function.

In some implementations, the called element, such as a Simulink® function block can have one or more variables/ports that are both input(s) and output(s) of a function. As described previously, such variables/ports are the so-called in-out variables/ports. An example of such a Simulink® function 1600 is shown in FIG. 14, which has a function prototype 1602: S=updateState(S,u). Here, argument S represents both an input and an output. For example, S can represent a current state of a system that is updated in association of its previous state S and a variable u. The Simulink® function block 1600 can allow intake of the previous state S and output of the current state S to be performed simultaneously within a single (i.e., the same) time step, without needing to use additional blocks, e.g., a unit delay block. Code generated for the argument S can include a pointer that allows writing of a value for the updated state S to the same address that stores the value for the previous state S. In this example, a declaration generated for a function in code that represents the Simulink® function 1600 can read:

void updateState(real_T rtu_u, real_T*rty_S)

where * denotes use of a pointer.

Figure 15:
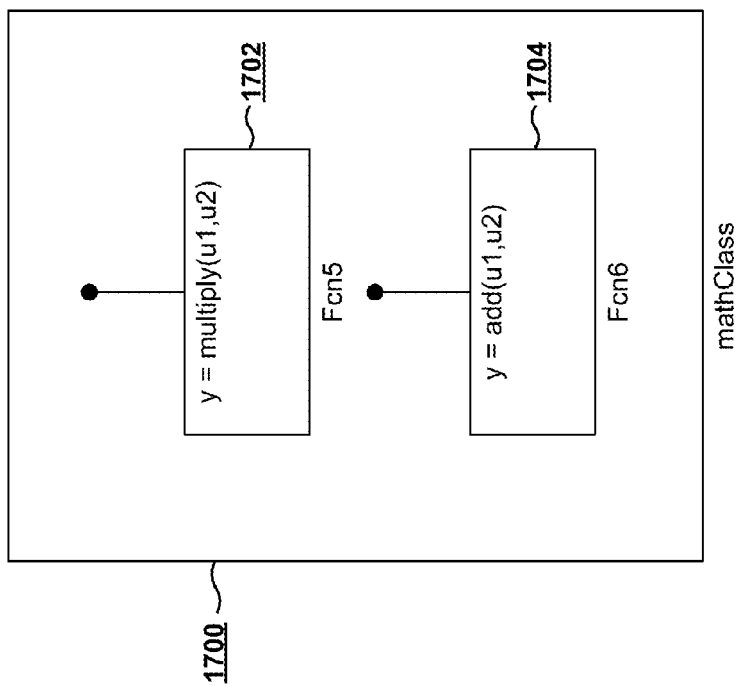
FIG. 15 is a diagram of an example C++ class.

In some implementations, two or more called elements, e.g., the Simulink® function blocks, can be placed in a subsystem. For example, the subsystem can represent a collection of functions that are generated as member functions of a C++ class. Member data of the C++ class for all inputs and outputs, e.g., internal inputs and outputs of the called elements, can include data that is available to any one of the called elements when any of the above described data access methods is implemented. An example of a C++ class 1700 is shown in FIG. 15, which includes two Simulink® function blocks 1702, 1704. The function prototypes of the two blocks 1702, 1704 are shown in the respective blocks. The declaration generated for a function in code that represents the class 1700 can read:

```
class mathClass {
    void add(real_T rtu_u, real_T*rty_y);
    void multiply(real_T rtu_u, real_T*rty_y);
}
```

In some implementations, when generating code, a device, such as the client device 210, can automatically implement function prototype control in the generated code such that the code complies with predetermined rules. Examples of the rules can be user specified rules that determine, for example, the order and names of arguments mapped from the input, output, in-output variables/ports of the blocks, and other properties of the arguments including argument qualifiers, e.g., being "const" or "volatile". In some implementations, implementing the function prototype control can change the declaration for a generated function in code from its default format to a predetermined format without affecting the generated code that defines the underlying function. The predetermined rules can be stored within the device, received from an input, or accessed from a remote storage.

As an example, declaration generated by default and based on the following function prototype, either of a function call block or of a Simulink® function block:

[y1, y2]=foo (x1, x2), reads:

void foo (type1 x1, type2 x2, type3, *y1, type4, *y2).

Based on this declaration, in order to properly call this function foo, a caller function always has to provide the arguments x1, x2, y1, and y2 in the sequence as listed in the declaration and the data for inputs x1 and x2 always have to be passed by value, instead of, for example, through pointers. However, if a rule about a different sequence of arguments is applied when generating the code, for example, a rule that requires one output directly follows one input, based on the rule and the function prototype, the declaration generated can read:

void foo (type1 x1, type3, *y1, type2 x2, type4, *y2).

In addition, the rule(s) can also specify that values of the input x1 and/or x2 to be passed using pointers. Furthermore, the names of the arguments can be changed to be different from the names of the input, output, or in-output ports or variables of the block. For example, x1 can be mapped to a different name, e.g., in1.

In some implementations, a device interacting with the caller element(s) and called element(s) maps the elements to a software environment, e.g., in which the AUTOSAR software architecture standard is implemented, and generates code that complies with standards implemented in the software environment. The AUTOSAR software architecture standard includes servers that specify arguments and clients that specify functions of the arguments. The function prototypes can be mapped to the clients and the variables/ports can be mapped to the servers. Although the AUTOSAR software architecture standard is described as an example, the description applies to other environments, such as C and C++ environments and can be generalized to all software environments supporting a service layer.

Figure 16:
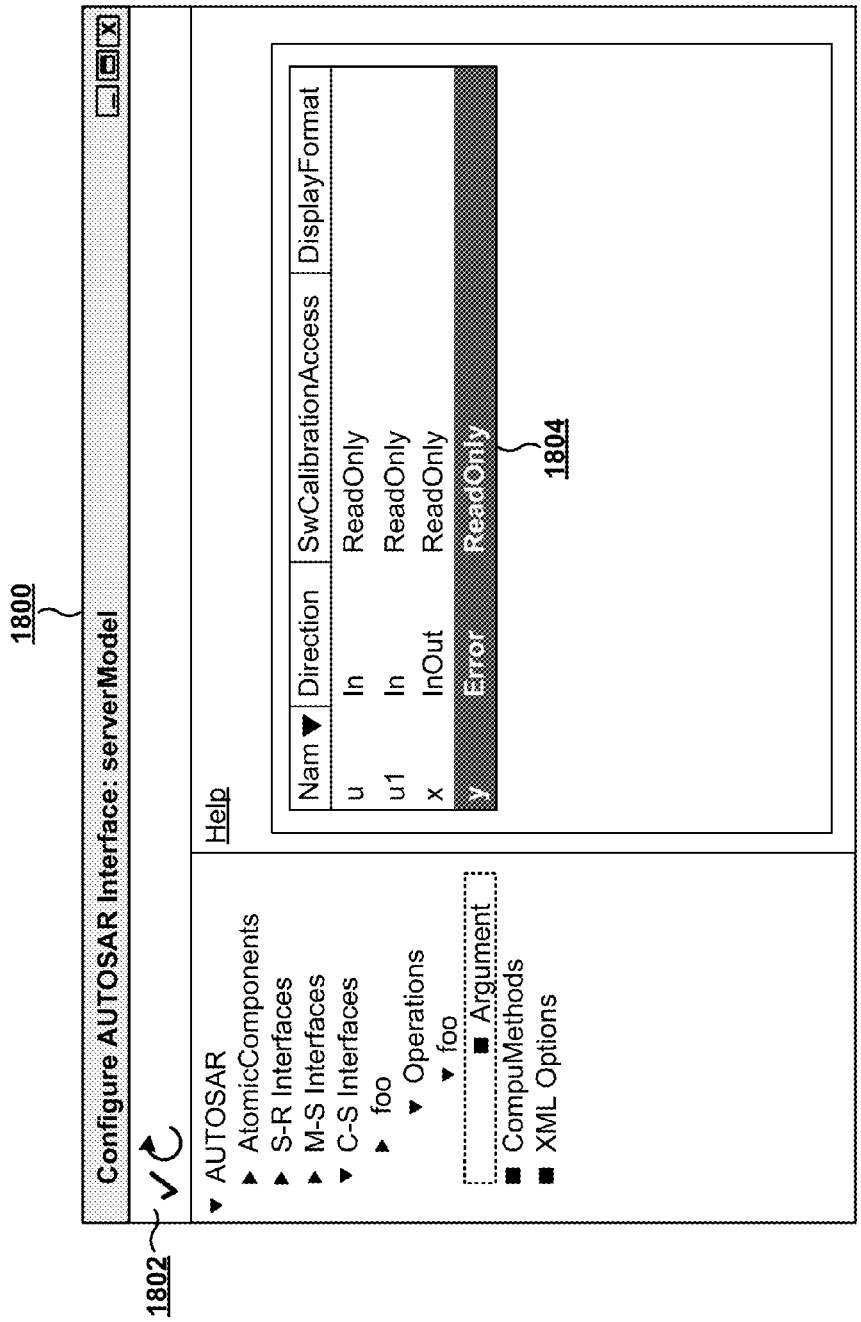
FIG. 16-19 are diagrams of example AUTOSAR interfaces.

For the purpose of discussion, the example discussed with respect to FIG. 8 is used to illustrate mapping of the caller and called elements into a software environment in which the AUTOSAR software architecture standard is implemented for generating AUTOSAR compliant code. Referring to FIG. 16, in a graphical user interface 1800, an AUTOSAR interface 1802 is presented. The interface 1800 may be accessible from an interface that displays the function caller block 804 and the Simulink® block 810. The interface 1802 displays specifications of an AUTOSAR server into which the variables of the function caller block 804 and the Simulink® function block 810 are to be mapped.

Figure 17:
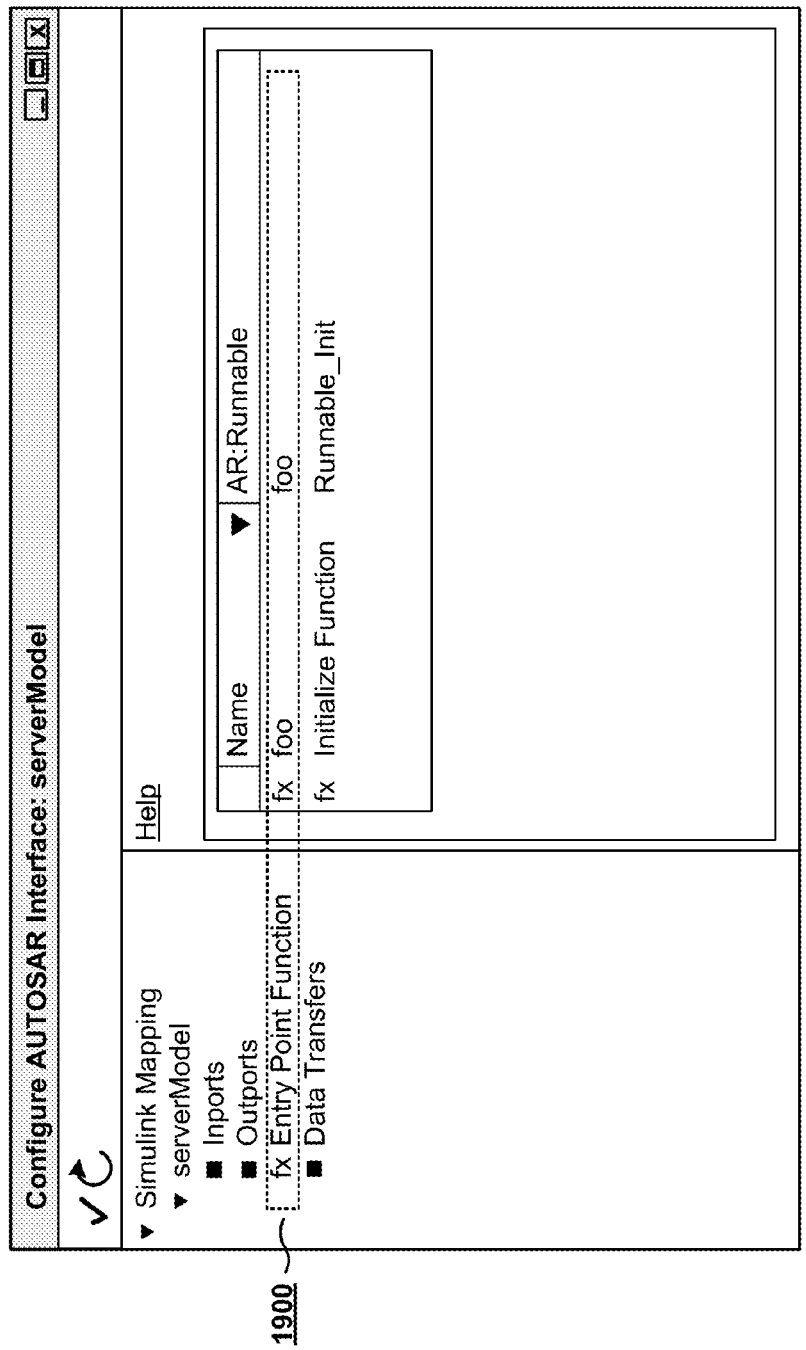

For example, the specification defines the names 1804 of the arguments for the generated code. Accordingly, input, output, and in-output variables of the function prototype: [x,y]=foo(u, $u_1$, x) are mapped to the arguments with the listed names 1804. The mapping between the arguments and the ports can be established by matching names. Further, referring to FIG. 17, the Simulink® function name "foo" is mapped to the function name in the generated, AUTOSAR compliant code, as "foo," according to the specification of an AUTOSAR client. The cross reference between the Simulink® function block 810 and the AUTOSAR function foo is defined as an entry function 1900.

Figure 18:
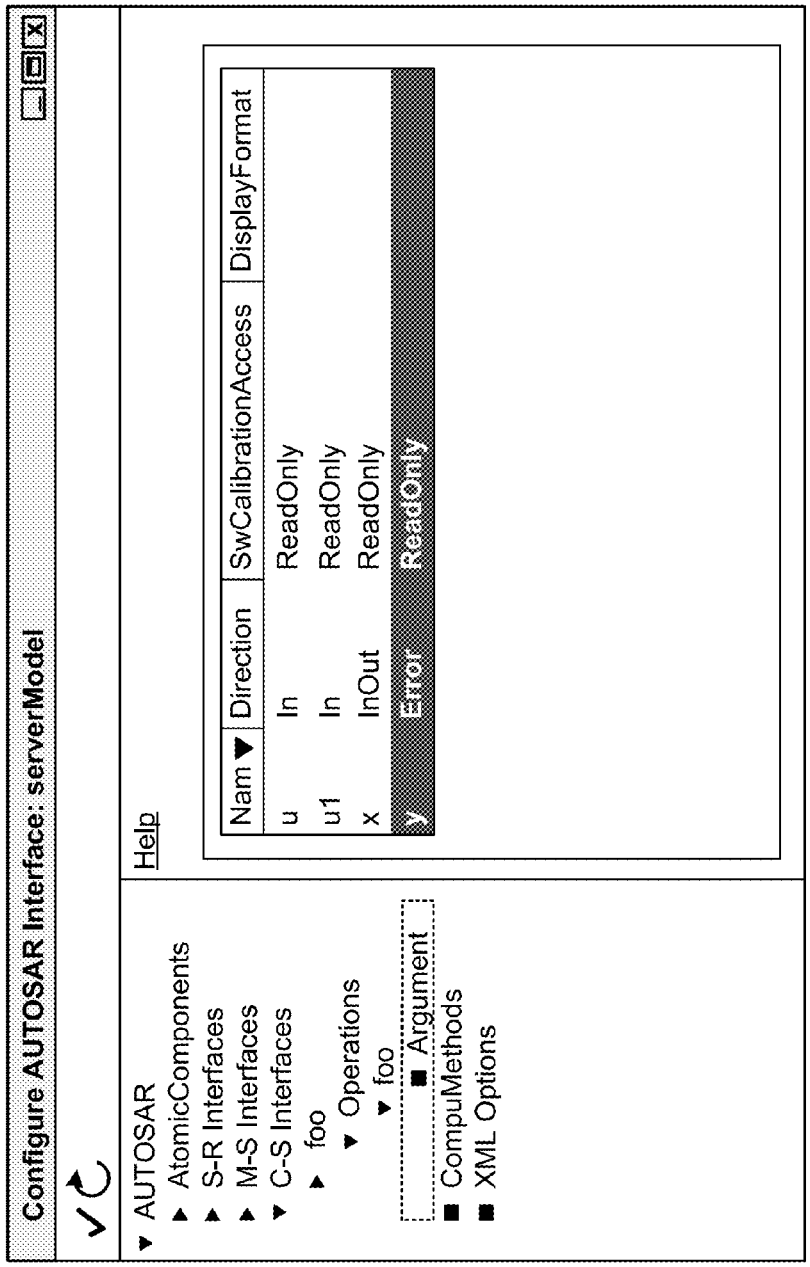
Figure 19:
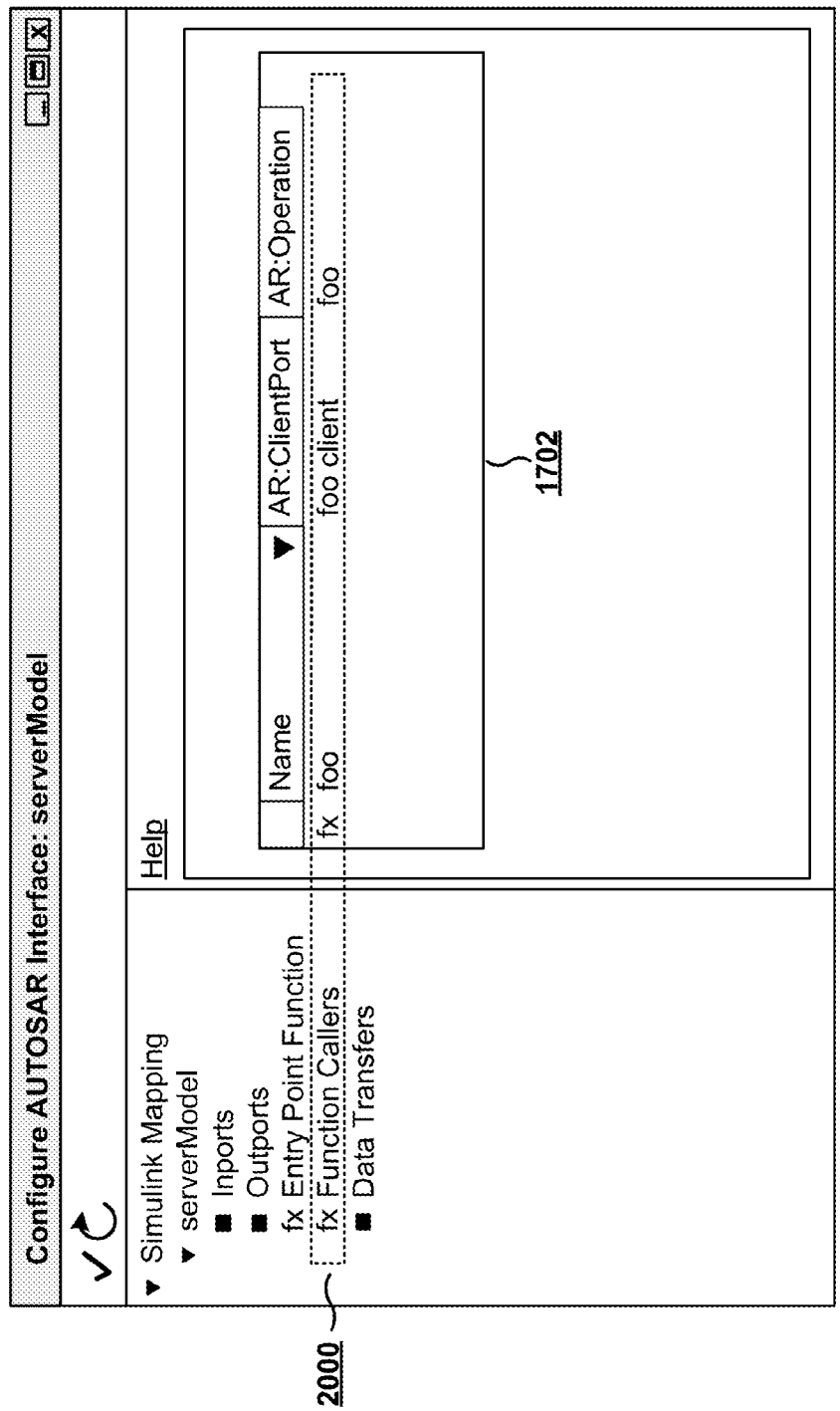

Similarly, referring to FIGS. 18 and 19, the function caller block 804 can be mapped to the software environment in which the AUTOSAR software architecture standard is implemented. FIG. 18 shows the mapping between the input and output ports/variables of the function caller block and the arguments of the function in the generated code. FIG. 19 shows the mapping between the names of the calling function in the function caller block and of the function in the AUTOSAR client. Compared to the mapping shown in FIG. 17, here for the function caller block, the cross reference between the function caller block and the AUTOSAR function is through a function call entry 2000, rather than being defined as an entry function, e.g., the entry function 1900 of FIG. 17.

The generated code for a model containing the function caller block 804 can use the AUTOSAR RTE to invoke the code for the Simulink® function 810. In some implementations, the code for the model containing the function caller block 804 does not make a direct call to the code implementing the Simulink® function. An example of the AUTOSAR compliant code generated for the function caller block 804 and the Simulink® function 810 is shown in FIG. 20, with the code highlighted in the rectangular block (shown by reference number 2100) showing the code for the function caller block 804 invoking the code for the Simulink® function 810 through AUTOSAR RTE (runtime environment).

In some implementations, when code is generated for an AUTOSAR target, e.g., hardware implemented in a car, the code generator also generates various artifacts in addition to the C code, including .arxml files. These artifacts can facilitate the embedding of the C code generated for the function into the AUTOSAR RTE, so that the code may be invoked using a client-server interface of the AUTOSAR, and partake in the benefits of the AUTOSAR RTE.

In some implementations, code, e.g., source code or executable code, can be generated from a model element, e.g., a caller element or a called element, using an intermediate representation of the model element. An example of the code generation is discussed in U.S. Pat. No. 7,020,850 and U.S. Pat. No. 8,234,105, the entire contents of which are incorporated by reference.

For example, a code generator can generate code by reading an initial representation of a model element, e.g., a caller block from a mass storage system. The initial representation can be parsed into an intermediate representation that includes linked lists of data objects corresponding to programming constructs (e.g. data structures and procedures) that are needed to emulate the model element. The code generator then generates source code in a high level programming language specified by the user, based on data objects in the intermediate representation. In some implementations, the generated code includes a set of functions and global variable declarations (see examples above). This source code can be stored on a mass storage system, from which it can be read by a source code compiler to generate executable object code therefrom. Alternatively or in addition to source code, the code generator can also generate executable code, e.g., in the form of object code, directly without obtaining the executable code from compiling a source code.

Systems and/or methods, described herein, may enable a client device to use a caller element that calls and/or provides inputs to a called element. The called element may receive inputs from the caller element and/or from a called model that includes the called element. Based on the inputs, the called element may provide outputs to the caller element, which may allow the caller element to execute the called element without executing the entire called model, and to determine information related to the called model that includes the called element.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, and/or a combination of hardware and software.

Program code (sometimes referred to herein as code) is to be broadly interpreted to include text-based code that may not require further processing to execute (e.g., C code, C++ code, Hardware Description Language (HDL) code, very-high-speed integrated circuits (VHSIC) HDL (VHDL) code, Verilog code, Java code, Ada code, another type of hardware and/or software based code that may be compiled and/or synthesized, etc.), binary code that may be executed (e.g., executable files that may be directly executed by an operating system, bitstream files that may be used to configure an FPGA, Java byte code, object files combined together with linker directives, source code, makefiles, etc.), text files that may be executed in conjunction with other executables (e.g., Python text files, Octave files, a collection of dynamic-link library (DLL) files with text-based combining, configuration information that connects pre-compiled modules, an extensible markup language (XML) file describing module linkage, etc.), source code (e.g., readable by a human), machine code (e.g., readable by a machine), or the like. In some implementations, program code may include different combinations of the above-identified classes of code (e.g., text-based code, binary code, text files, source code, machine code, etc.). Additionally, or alternatively, program code may include code generated using a dynamically-typed programming language (e.g., the M language, a MATLAB® language, a MATLAB-compatible language, a MATLAB-like language, etc.) that may be used to express problems and/or solutions using mathematical notations. Additionally, or alternatively, program code may be of any type, such as a function, a script, an object, etc. In some implementations, a function can be one or more sections of code that performs one or more specific tasks. For example, a function in code can be a type of procedure or routine, which can return one or more values or perform operations without returning any value. Examples of functions as part of the generated code can include C functions, C++ class methods, and other types of functions.

Certain user interfaces have been described herein and/or shown in the figures. A user interface may include a graphical user interface, a non-graphical user interface, a text-based user interface, etc. A user interface may provide information for display. In some implementations, a user may interact with the information, such as by providing input via an input component of a device that provides the user interface for display. In some implementations, a user interface may be configurable by a device and/or a user (e.g., a user may change the size of the user interface, information provided via the user interface, a position of information provided via the user interface, etc.). Additionally, or alternatively, a user interface may be pre-configured to a standard configuration, a specific configuration based on a type of device on which the user interface is displayed, and/or a set of configurations based on capabilities and/or specifications associated with a device on which the user interface is displayed.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items, and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A method comprising:
    receiving function information that describes a caller element that, when executed, calls a called element that is separate from the caller element,
        the function information identifying a name or reference of the called element, a passed input, and a passed output,
        the passed input being provided by the caller element to the called element,
        the passed output being received by the caller element from the called element,
        the caller element being associated with a caller model, and
        the called element being associated with a called model, the called model comprising a plurality of elements to be executed,
    the receiving the function information being performed by one or more devices;
    identifying the called element based on the function information,
        the identifying being performed by the one or more devices;
    executing the caller element in a simulation environment, whereby the execution of the caller element causes the simulation environment to execute the called element without causing execution of an entirety of the called model, in particular without executing all of the plurality of elements in the called model,
        the executing being performed by the one or more devices; and
    receiving the passed output from the called element based on executing the called element,
        the receiving the passed output being performed by the one or more devices.

2. The method of claim 1, further comprising:
    receiving the passed output based on the passed input and an internal input,
        the internal input being received by the called element from an element other than the caller element.

3. The method of claim 2, further comprising:
    producing an internal output based on the internal input; and
    providing the internal output to another element of the called model,
        the internal output not being provided to the caller element.

4. The method of claim 1, further comprising:
    providing the passed input to the called element based on executing the caller element; and
    receiving the passed output from the called element based on providing the passed input to the called element.

5. The method of claim 4, wherein the passed input and the passed output are input and output of an in-out variable included in the caller element.

6. The method of claim 1, further comprising:
    implementing a first type of modeling environment,
        wherein the first type of modeling environment is a graphical modeling environment and the caller element is modeled as a graphical element and/or block within the graphical modeling environment; and
    wherein the execution of the caller element causes an interpretation of parameters associated with the caller element at runtime.

7. The method of claim 6, wherein the called element is associated with a second type of modeling environment, wherein the execution of the called element causes an interpretation of parameters associated with the called element at runtime.

8. The method of claim 1, wherein the called element is called by one or more of a plurality of caller elements; and
    the method further comprising:
        selecting one or more caller elements of the plurality of caller elements for execution,
            the one or more caller elements being selected based on a queue that includes the one or more caller elements.

9. The method of claim 8, wherein the one or more caller elements are executable in a graphical modeling environment.

10. The method of claim 1, further comprising:
   determining a plurality of called elements,
      the plurality of called elements being determined based on a function identifier; and
   selecting one or more called elements of the plurality of called elements for execution,
      the one or more called elements being selected based on at least one of:
         a conflict rule used for selecting the one or more called elements based on a conflict between called elements, or
         a scope-based rule used for selecting one or more called elements based on a relationship of scope between the one or more called elements and the caller element.

11. The method of claim 1, wherein the function information includes a function prototype.

12. The method of claim 1, further comprising:
   generating code for one or more of the caller element, the called element, the passed input, the passed output, or the function information.

13. The method of claim 1, further comprising:
   locating the called element based on a function identifier and based on a scope associated with the called element,
      the scope being indicated by the function information, and
      the scope identifying a locality of the called element.

14. The method of claim 13, wherein the scope comprises one or more models, one or more sub-models, one or more modeling environments, a private scope, or a public scope within which to locate the called element.

15. The method of claim 1, further comprising:
   determining the called element by generating a template,
      the template facilitating an interaction to describe the called element, and
      the template being generated based on the function information.

16. The method of claim 1, wherein the function information includes a sample rate indicator,
      the sample rate indicator indicating a sample rate at which to call the called element; and
   wherein executing the caller element further comprises:
      executing the caller element based on the sample rate.

17. The method of claim 1, wherein the caller model and the called model are a same model.

18. The method of claim 1, wherein the caller model and the called model are different models.

19. A computer-readable medium storing instructions, the instructions comprising:
   one or more instructions that, when executed by one or more processors, cause the one or more processors to:
      receive function information that describes a caller element that, when executed, calls a called element that is separate from the caller element,
         the function information identifying a name or reference of the called element, a passed input, and a passed output,
         the passed input being provided by the caller element to the called element,
         the passed output being received by the caller element from the called element,
         the caller element being associated with a caller model, and
         the called element being associated with a called model, the called model comprising a plurality of elements to be executed;
      identify the called element based on the function information;
      execute the caller element in a simulation environment, whereby the execution of the caller element causes the simulation environment to execute the called element without causing execution of an entirety of the called model, in particular without executing all of the plurality of elements in the called model; and
      receive the passed output from the called element based on executing the called element.

20. The computer-readable medium of claim 19, wherein the one or more instructions, when executed by the one or more processors, cause the one or more processors to:
   receive the passed output based on the passed input and an internal input,
      the internal input being received by the called element from an element other than the caller element.

21. The computer-readable medium of claim 20, wherein the one or more instructions, when executed by the one or more processors, cause the one or more processors to:
   produce an internal output based on the internal input; and
   provide the internal output to another element of the called model,
      the internal output not being provided to the caller element.

22. The computer-readable medium of claim 19, wherein the one or more instructions, when executed by the one or more processors, cause the one or more processors to:
   provide the passed input to the called element based on executing the caller element; and
   receive the passed output from the called element based on providing the passed input to the called element.

23. The computer-readable medium of claim 22, wherein the passed input and the passed output are input and output of an in-out variable included in the caller element.

24. The computer-readable medium of claim 19, wherein the caller model and the called model are a same model.

25. The computer-readable medium of claim 19, wherein the caller model and the called model are different models.

26. The computer-readable medium of claim 19, wherein the one or more instructions, when executed by the one or more processors, further cause the one or more processors to:
   locate the called element based on a function identifier and based on a scope associated with the called element,
      the scope being indicated by the function information, and
      the scope identifying a locality of the called element,
      wherein the scope comprises one or more models, one or more sub-models, one or more modeling environments, a private scope, or a public scope within which to locate the called element.

27. The computer-readable medium of claim 19, wherein the called element is called by one or more of a plurality of caller elements,
   wherein the one or more instructions, when executed by the one or more processors, cause the one or more processors to:
      select one or more caller elements of the plurality of caller elements for execution,
         wherein the one or more caller elements are selected based on a queue that includes the one or more caller elements, and
         wherein the one or more caller elements are executable in a graphical modeling environment.

28. A device, comprising:
one or more processors to:
receive function information that describes a caller element that, when executed, calls a called element that is separate from the caller element,
the function information identifying a name or reference of the called element, a passed input, and a passed output,
the passed input being provided by the caller element to the called element,
the passed output being received by the caller element from the called element,
the caller element being associated with a caller model, and
the called element being associated with a called model, the called model comprising a plurality of elements to be executed;
identify the called element based on the function information;
execute the caller element in a simulation environment, whereby the execution of the caller element causes the simulation environment to execute the called element without causing execution of an entirety of the called model, in particular without executing all of the plurality of elements in the called model; and
receive the passed output from the called element based on executing the called element.

29. The device of claim 28, wherein the one or more processors are to:
implement a first type of modeling environment, wherein the first type of modeling environment is a graphical modeling environment and the caller element is modeled as a graphical element and/or block within the graphical modeling environment; and
wherein the execution of the caller element causes an interpretation of parameters associated with the caller element at runtime.

30. The device of claim 29, wherein the called element is associated with a second type of modeling environment, wherein the execution of the called element causes an interpretation of parameters associated the called element at runtime.

31. The device of claim 28, wherein the caller model and the called model are a same model.

32. The device of claim 28, wherein the caller model and the called model are different models.

33. The device of claim 28, wherein the one or more processors are further to:
provide the passed input to the called element based on executing the caller element; and
receive the passed output from the called element based on providing the passed input to the called element,
wherein the passed input and the passed output are input and output of an in-out variable included in the caller element.

34. The device of claim 28, wherein the one or more processors are further to:
locate the called element based on a function identifier and based on a scope associated with the called element,
the scope being indicated by the function information, and
the scope identifying a locality of the called element,
wherein the scope comprises one or more models, one or more sub-models, one or more modeling environments, a private scope, or a public scope within which to locate the called element.

35. The device of claim 28, wherein the called element is called by one or more of a plurality of caller elements,
wherein the one or more processors are further to:
select one or more caller elements of the plurality of caller elements for execution,
wherein the one or more caller elements are selected based on a queue that includes the one or more caller elements, and
wherein the one or more caller elements are executable in a graphical modeling environment.

* * * * *